(12) United States Patent
Lu et al.

(10) Patent No.: US 12,731,629 B2
(45) Date of Patent: Sep. 8, 2026

(54) EFFICIENT COORDINATION OF ERROR HANDLING AND USAGE-BASED-DISTURBANCE MITIGATION

(71) Applicant: Micron Technology, Inc., Boise, ID (US)

(72) Inventors: Yang Lu, Boise, ID (US); Donald Morgan, Meridian, ID (US); Mark Kalei Hadrick, Boise, ID (US); Victor Wong, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 108 days.

(21) Appl. No.: 18/762,054

(22) Filed: Jul. 2, 2024

(65) Prior Publication Data

US 2026/0011358 A1 Jan. 8, 2026

(51) Int. Cl.

| | |
|---|---|
| ***G11C 11/40*** | (2006.01) |
| ***G11C 11/406*** | (2006.01) |
| ***G11C 29/52*** | (2006.01) |

(52) U.S. Cl.

CPC .. *G11C 11/40615* (2013.01); *G11C 11/40618* (2013.01); *G11C 29/52* (2013.01)

(58) Field of Classification Search

CPC ........ G11C 11/40615; G11C 11/40618; G11C 29/52

See application file for complete search history.

(56) References Cited

U.S. PATENT DOCUMENTS

| | | | |
|---|---|---|---|
| 4,912,698 A | 3/1990 | Bitzinger et al. | |
| 9,940,457 B2 | 4/2018 | Healy et al. | |
| 11,537,468 B1 | 12/2022 | Ghosh et al. | |
| 12,561,198 B2 | 2/2026 | Lu et al. | |
| 2008/0155246 A1 | 6/2008 | Jennings et al. | |
| 2019/0066759 A1 * | 2/2019 | Nale | G11C 11/40618 |

(Continued)

OTHER PUBLICATIONS

"Notice of Allowance", U.S. Appl. No. 18/762,130, Oct. 20, 2025, 8 pages.

*Primary Examiner* — Mohammed A Bashar
(74) *Attorney, Agent, or Firm* — Colby Nipper PLLC

(57) ABSTRACT

Apparatuses and techniques for efficient handling of data errors and usage-based disturbances are described. To enable efficient utilization of time-limited resources, a memory device includes control circuitry that performs multiple different types of operations responsive to "confiscating" a refresh-pump time interval. The memory device is responsible for performing various functionalities internally while reducing the impact such functionalities may have on servicing memory requests from an external entity. Accordingly, a memory device may confiscate refresh-pump opportunities and instead perform other operations. To efficiently utilize a refresh-pump opportunity, the control circuitry can perform an error-handling operation on a codeword stored in a first bank and perform a usage-based disturbance mitigation operation on a row in a second bank during the confiscated time interval. Further, the usage-based disturbance mitigation operation can be performed across multiple banks except for the first bank. In this manner, various internal functionalities can be achieved efficiently.

20 Claims, 20 Drawing Sheets

(56) References Cited

U.S. PATENT DOCUMENTS

2020/0185024 A1 6/2020 Rehmeyer et al.
2020/0201718 A1 6/2020 Richter et al.
2020/0211632 A1 7/2020 Noguchi
2020/0227113 A1 7/2020 Rehmeyer et al.
2020/0341840 A1 10/2020 Chang et al.
2020/0388324 A1 12/2020 Rehmeyer et al.
2021/0286670 A1 9/2021 Rooney et al.
2022/0012131 A1 1/2022 Wang et al.
2022/0058080 A1 2/2022 Chen
2022/0148674 A1 5/2022 Qiao et al.
2022/0179556 A1 6/2022 Miller et al.
2022/0342740 A1 10/2022 Luo et al.
2023/0178170 A1 6/2023 Takizawa
2023/0238045 A1* 7/2023 Kim .................. G11C 11/40618 365/222
2024/0119985 A1* 4/2024 Benedict ............... G11C 11/408
2025/0068520 A1 2/2025 Caprìet al.
2026/0010427 A1 1/2026 Lu et al.

* cited by examiner

Figure 3:
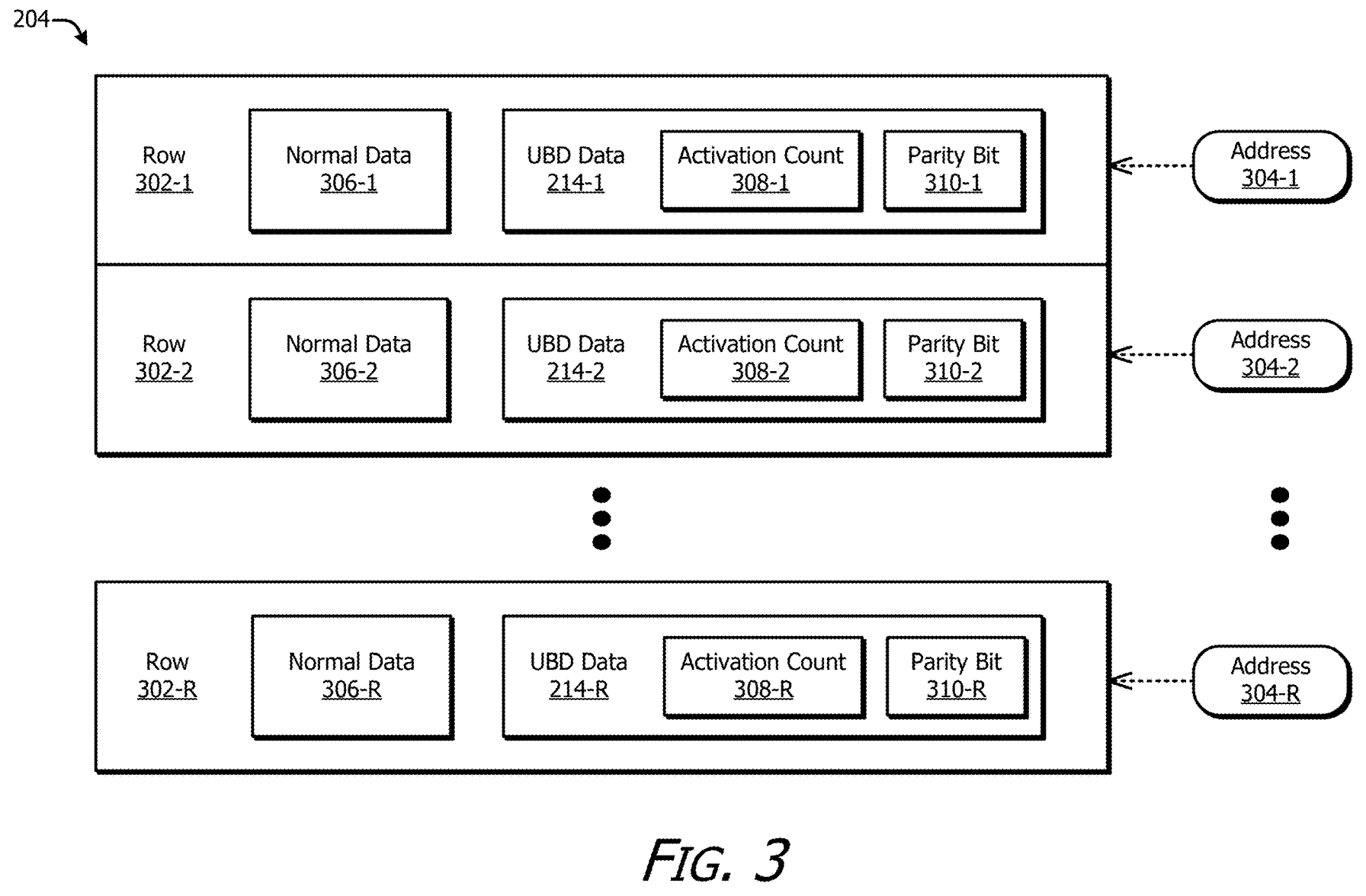

204

Address 304-1

Address 304-2

Address 304-R

Row 302-1

Normal Data 306-1

UBD Data 214-1

Activation Count 308-1

Parity Bit 310-1

Row 302-2

Normal Data 306-2

UBD Data 214-2

Activation Count 308-2

Parity Bit 310-2

Row 302-R

Normal Data 306-R

UBD Data 214-R

Activation Count 308-R

Parity Bit 310-R

| BA \ BG | 1 | 2 | 3 | 4 | 5 | 6 | 7 | 8 |
|---|---|---|---|---|---|---|---|---|
| 1 | UBD Mitigation | UBD Mitigation | UBD Mitigation | UBD Mitigation | UBD Mitigation | UBD Mitigation | UBD Mitigation | UBD Mitigation |
| 2 | UBD Mitigation | UBD Mitigation | UBD Mitigation | EH | UBD Mitigation | UBD Mitigation | UBD Mitigation | UBD Mitigation |
| 3 | UBD Mitigation | UBD Mitigation | UBD Mitigation | UBD Mitigation | UBD Mitigation | UBD Mitigation | UBD Mitigation | UBD Mitigation |
| 4 | UBD Mitigation | UBD Mitigation | UBD Mitigation | UBD Mitigation | UBD Mitigation | UBD Mitigation | UBD Mitigation | UBD Mitigation |

| BG / BA | 1 | 2 | 3 | 4 | 5 | 6 | 7 | 8 |
|---|---|---|---|---|---|---|---|---|
| 1 | Idle | Idle | Idle | Idle | Idle | Idle | Idle | Idle |
| 2 | UBD Mitigation | UBD Mitigation | UBD Mitigation | EH | UBD Mitigation | UBD Mitigation | UBD Mitigation | UBD Mitigation |
| 3 | Idle | Idle | Idle | Idle | Idle | Idle | Idle | Idle |
| 4 | Idle | Idle | Idle | Idle | Idle | Idle | Idle | Idle |

FIG. 10-2

Perform, during a refresh-pump time interval, an error-handling operation on a codeword stored in a first bank of multiple banks

1102

Perform, during the refresh-pump time interval, a usage-based-disturbance (UBD) mitigation operation on a row in a second bank of the multiple banks

1104

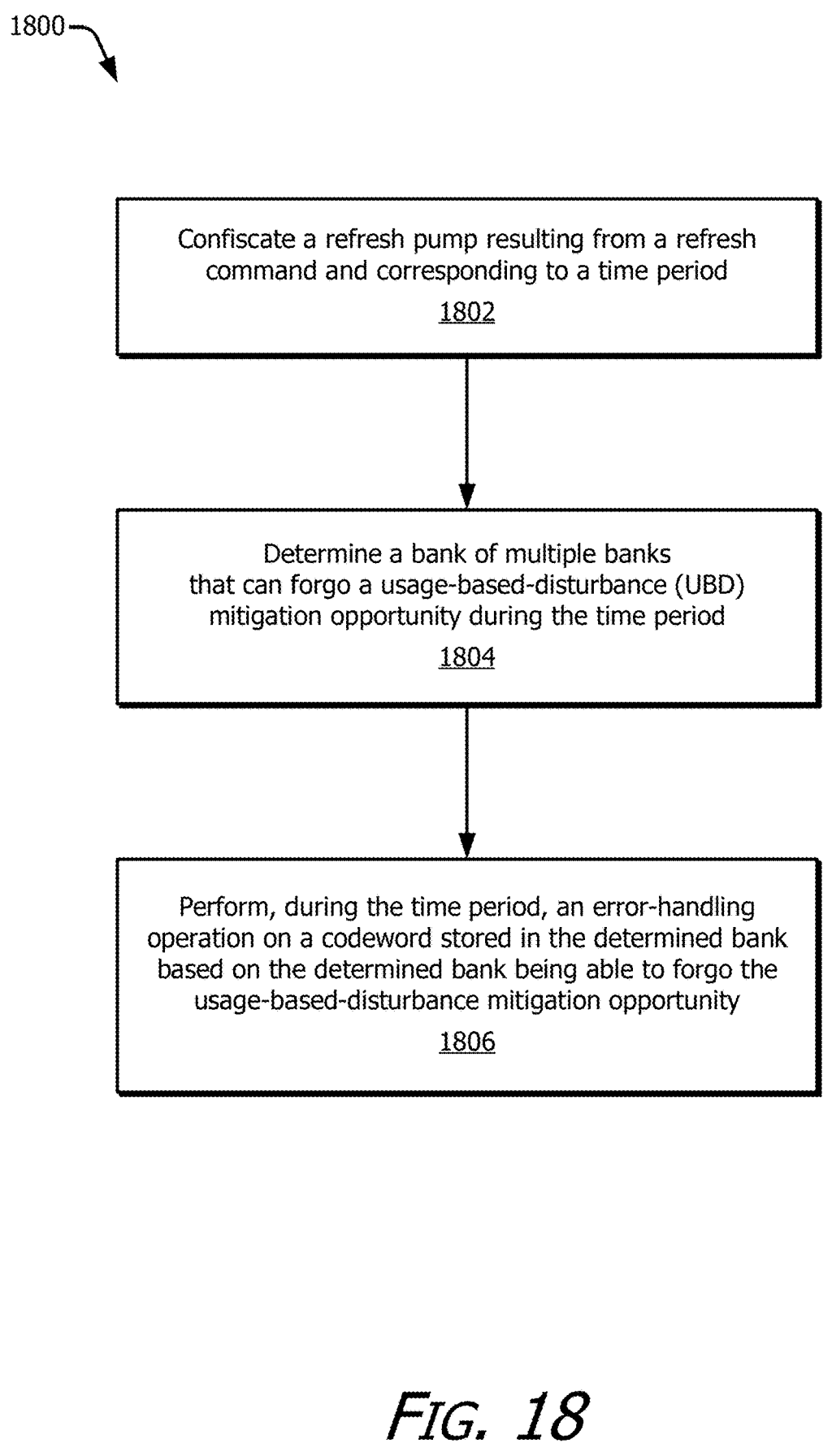

1800

Confiscate a refresh pump resulting from a refresh command and corresponding to a time period
1802

Determine a bank of multiple banks that can forgo a usage-based-disturbance (UBD) mitigation opportunity during the time period
1804

Perform, during the time period, an error-handling operation on a codeword stored in the determined bank based on the determined bank being able to forgo the usage-based-disturbance mitigation opportunity
1806

FIG. 18

EFFICIENT COORDINATION OF ERROR HANDLING AND USAGE-BASED-DISTURBANCE MITIGATION

BACKGROUND

Computers, smartphones, and other electronic devices rely on processors and memories. A processor executes code based on data to run applications and provide features to a user. The processor obtains the code and the data from a memory. The memory in an electronic device can include volatile memory (e.g., random-access memory (RAM)) and non-volatile memory (e.g., flash memory). Like the capabilities of a processor, the capabilities of a memory can impact the performance of an electronic device. This performance impact can increase as processors are developed that execute code faster and as applications operate on increasingly larger data sets that require ever-larger memories.

BRIEF DESCRIPTION OF THE DRAWINGS

Apparatuses of and techniques for efficient coordination of error handling and usage-based-disturbance mitigation are described with reference to the following drawings. The same numbers are used throughout the drawings to reference like features and components:

FIG. 3 illustrates example approaches to storing data within rows of a memory array to support usage-based-disturbance mitigation;

FIG. 5-1 illustrates an example arrangement of circuits that can implement aspects of efficient coordination of error handling and usage-based-disturbance mitigation;

FIG. 5-2 illustrates an example communication scheme between two or more circuits that can implement aspects of efficient coordination of error handling and usage-based-disturbance mitigation;

FIG. 10-1 illustrates a first example scheme for performing at least one error-handling operation and one or more usage-based-disturbance mitigation operations across at least two banks of multiple banks of memory;

FIG. 10-2 illustrates a second example scheme for performing at least one error-handling operation and one or more usage-based-disturbance mitigation operations across at least two banks of multiple banks of memory;

FIG. 18 illustrates an example method for implementing aspects of communicating if a bank can forgo a usage-based-disturbance mitigation opportunity in favor of error handling to support efficient coordination of error handling and usage-based-disturbance mitigation.

DETAILED DESCRIPTION

Overview

Figure 1:
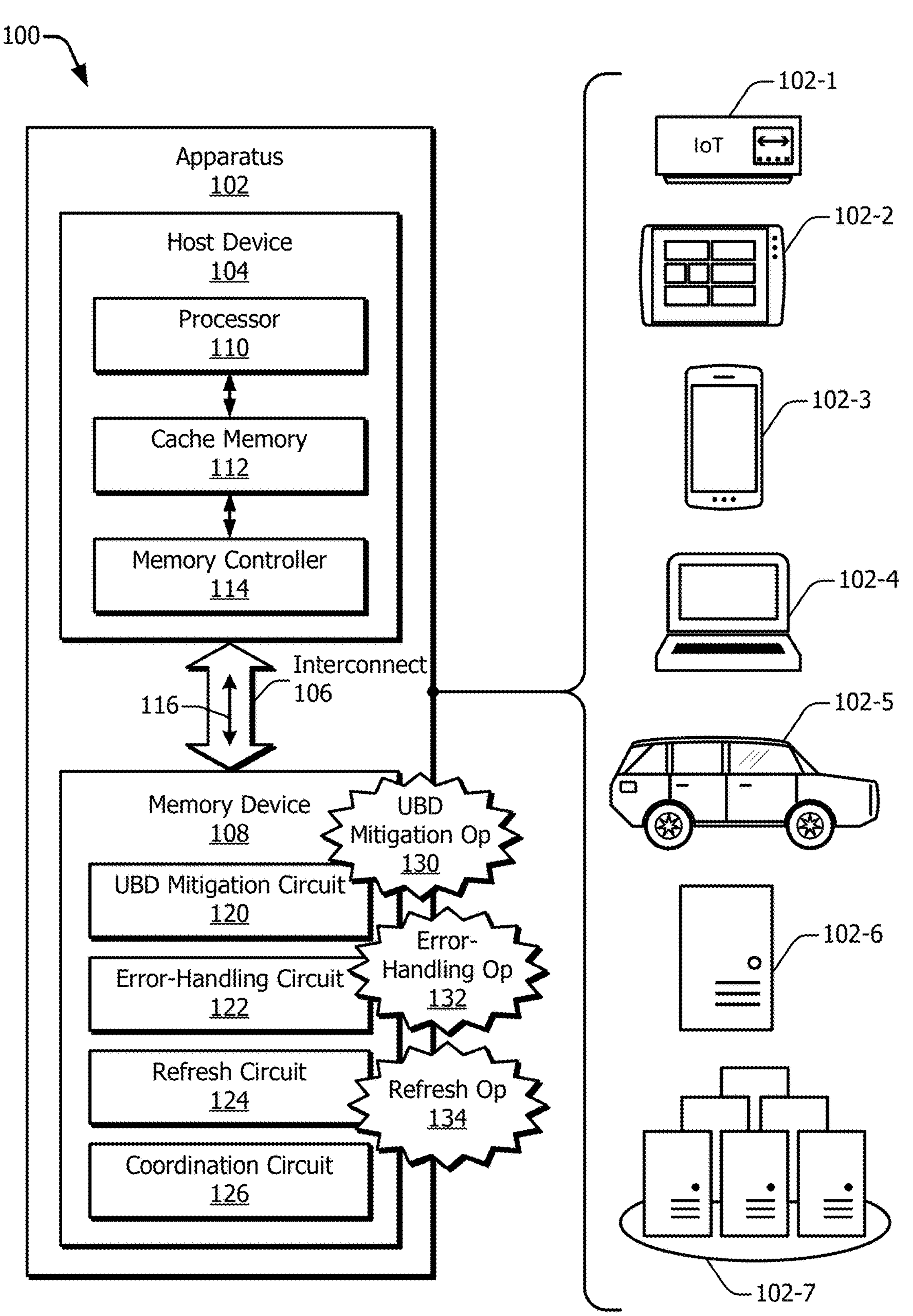
FIG. 1 illustrates example apparatuses that can implement aspects of efficient coordination of error handling and usage-based-disturbance mitigation.

Processors and memory work in tandem to provide features to users of computers and other electronic devices. As processors and memory operate more quickly together in a complementary manner, an electronic device can provide enhanced features, such as high-resolution graphics and artificial intelligence (AI) analysis. Some applications, such as those for financial services, medical devices, and advanced driver assistance systems (ADAS), can also demand more-reliable memories. These applications use increasingly reliable memories to limit errors in financial transactions, medical decisions, and object identification, respectively. In some implementations, however, more-reliable memories can sacrifice bit density, power efficiency, and simplicity.

Generally, a memory device is expected to service memory requests from a host device within predetermined time periods and/or with predictable delay durations. These constraints mean that the memory device prioritizes memory requests from an external entity, such as a memory controller of a host device. A modern memory device, however, has additional expectations beyond servicing memory requests. For example, to create a more-reliable memory, a memory device is expected to combat attacks from bad actors, such as usage-based-disturbance (UBD) attacks, which are described below. Thus, a memory device may perform usage-based-disturbance mitigation operations in conjunction with servicing memory requests. As another example, a memory device is expected to counteract data bit errors that arise from manufacturing defects or randomized events, which errors can be exacerbated by higher operating temperatures. Thus, a memory device may perform error-handling operations, which are also described below.

It can be challenging, however, to perform these various functionalities without unduly impacting the performance of a memory device's core duty of servicing memory requests. Accordingly, this document describes apparatuses and techniques for combating usage-based disturbances and for counteracting data errors in an efficient manner to reduce their impact on the servicing of memory requests. The usage-based disturbance phenomenon is described next and is followed by issues with ensuring data remains accurate and error-free.

To meet the demands for physically smaller memories, memory devices can be designed with higher chip densities for the memory cells. Increasing chip density, however, can increase the electromagnetic coupling between proximate rows of memory cells due, at least in part, to a shrinking distance between these rows. With this undesired electromagnetic coupling (e.g., capacitive coupling), activation (or charging) of a first row of memory cells can sometimes negatively impact the integrity of the digital values stored in a second nearby row of memory cells. This phenomenon is referred to as usage-based disturbance herein. Activation of the first row can generate interference, or crosstalk, that causes the second row to experience a voltage fluctuation. In some instances, this voltage fluctuation can cause a state, or value, of a memory cell in the second row to be incorrectly determined by a sense amplifier. Consider an example in which a state of a memory cell in the second row is a logical "1" (e.g., a high voltage). In this example, the voltage fluctuation can cause a sense amplifier to incorrectly determine the state of the memory cell to be a logical "0" (e.g., a low voltage) instead of a logical "1." Left unchecked, this interference can lead to memory errors or data loss within the memory device.

In some circumstances, a particular row of memory cells is activated repeatedly in an unintentional or intentional manner, which can be part of a malicious act. Such a row that is repeatedly activated is referred to herein as an aggressor row. Consider, for instance, that memory cells in an $R^{th}$ row are subjected to repeated activation, which causes one or more memory cells in a proximate row (e.g., an adjacent row) to change states. Here, a proximate row can include another row within an R+1 row, which is an adjacent row; an R+2 row; an R−1 row, which is another adjacent row; and/or an R−2 row. These proximate rows are referred to herein as victim rows. The effect of changed memory states is referred to as a usage-based disturbance. The occurrence of usage-based disturbance can lead to the corruption or changing of contents within the affected row of memory. As described herein below, to combat the negative effects of usage-based disturbance, a memory device can perform usage-based-disturbance mitigation operations.

With respect to monitoring for and detecting data errors, data bit errors can arise from multiple different causes in addition to usage-based disturbance. Examples of such causes include temperature increases, mechanical stresses, background radiation, and a manufacturing defect that goes undetected or worsens over time. By adding redundant information in the form of check bits to the data bits that store user information, bit errors can be detected or may even be detected and corrected. These check bits can be realized as, for example, a parity bit, an error correction code (ECC), and so forth. With an ECC, a quantity of bit errors that can be detected or corrected may vary based on how long the ECC is relative to the length of the data bits. For instance, an ECC of a given length may enable the detection of two one-bit errors in the data bits or the detection and correction of a single one-bit error in the data bits. In some cases, but by way of example only, 64 data bits may be associated with 8 check bits. As described herein below, to counteract data bit errors, a memory device can perform error-handling operations.

In an error-detection context, a codeword refers to a combination of the data bits and associated check bits. Memory may therefore be checked for data errors in units of codewords. In some memory devices, the accuracy of stored data is checked repeatedly using codewords. An example of a technique or technology to check data accuracy is called error check and scrub (ECS), or error checking and scrubbing. ECS can be used to provide ECC transparency and error remediation, which can involve error monitoring, such as error counting and categorizing. Further, the circuitry for ECS can report a quantity of detected and/or corrected errors within some prescribed timeframe, such as each 24-hour period.

In example operations, an ECS mode enables the memory device to internally read data bits from an array, correct bit errors of some amount (e.g., single-bit errors or double-bit errors), and write back to the array corrected data bits to thereby scrub detected errors. By tracking detections and corrections, the memory device can expose such error counts to an external entity to thereby provide transparency to error events and an indication of the overall reliability or health of the memory device. The ECS functionality can be operated in various modes, including a manual ECS mode and an automatic ECS mode. The mode option may be set, for instance, via a mode register. In the manual ECS mode, ECS operations can be controlled by a memory controller via a multi-purpose command (MPC) or a register-based command. In the automatic ECS mode, the memory device may internally control the execution of ECS-related operations while still meeting various performance requirements, including those relating to the ECS functions, usage-based-disturbance mitigation functions, and functions supporting the performance of actual memory input/output requests.

Thus, a memory device may be designed to perform multiple types of operations to improve performance, even if such operations do not directly support responding to a regular memory input/output request. The example operations described above include usage-based-disturbance mitigation operations and error-handling operations. An issue with performing such operations is that these operations use some of the same array-accessing circuitry that is used to respond to external memory input/output requests, like sense amplifiers, write drivers, word lines, or bit lines. Consequently, fulfilling memory read and write requests for a host device can be slowed or even blocked while performing these other operations. This document describes schemes to reduce the impacts on fulfilling read and write requests while performing other operations.

One approach involves leveraging time intervals that are already assigned to perform functionality that does not entail reading or writing data for an external host. These time intervals relate, for instance, to refreshing memory to preserve a stored charge. The refresh-related time intervals can be "confiscated" (e.g., "appropriated," "commandeered," or "stolen") for other purposes, such as usage-based-disturbance mitigation and error handling. Refreshing memory and the time intervals that are used for memory refreshing are described next.

Memory devices store data using memory cells. With some volatile memory devices, such as those using dynamic random-access memory (DRAM), each memory cell can store one bit of data with one capacitor using a voltage level (e.g., a high or low voltage level). Unfortunately, each memory cell of a volatile memory array can leak charge from the capacitor over time, which leakage can cause the memory device to lose the data stored by the capacitor. To account for this charge leakage, the memory device periodically refreshes the charge on the memory cells using a refresh pump to restore the intended voltage level.

Especially as memory devices are designed with larger storage capacities, timing resources can become constrained due to the refreshing of larger quantities of memory cells within a given integrated circuit die or memory module. The limited timing resources available for performing refreshes, in conjunction with the increased quantities of memory cells, can add further challenges to mitigating usage-based disturbance and handling data errors. In other words, it can be difficult to confiscate enough refresh pump opportunities to safely keep the memory refreshed while also performing other internal operations without unduly impacting actual read/write memory operations. As memory devices increase the quantity of stored bits per integrated circuit chip (IC chip), there is a need to ensure that the timing resources available for performing usage-based-disturbance mitigation and error-handling are efficiently utilized.

As described herein, to maintain the integrity of data stored in DRAM cells, refresh pumps are provided to rows of memory during refresh-pump time intervals. A portion of these refresh-pump time intervals can be confiscated for other purposes. The quantity of refresh-pump time intervals that can be confiscated is limited, however, to avoid losing data in the DRAM cells or to meet a targeted specification parameter of the memory device. Accordingly, the confiscated refresh-pump time intervals should be used efficiently. In some approaches, a confiscated refresh-pump time interval is assigned to at least one error-handling operation, such as for ECS. Meanwhile, a different confiscated refresh-pump time interval is assigned to at least one UBD mitigation operation, which results in two confiscated refresh-pump time intervals being consumed for the two types of operations.

In approaches that are described herein, however, a given refresh-pump time interval is assigned to at least one error-handling operation and at least one UBD mitigation operation. Thus, two different types of operations can be performed during one refresh-pump time interval. For one type of operation, in an ECS context for example, error handling may entail tracking and reporting detected and corrected errors. In some cases, circuitry that performs the detection and correction may be included on a memory chip on a per-bank basis. The tracking and reporting circuitry, on the other hand, may be included on a centralized, per-chip basis, or otherwise shared across multiple banks (e.g., on a shared-bank basis). In such cases, the centralized, bank-shared error-handling circuitry is used to support the bank-level, bank-specific error-handling circuitry. This means it can be infeasible to perform the per-bank error-handling procedure across all the banks at one time, or even across more than one bank at the same time. Although this constraint may be ameliorated by adding more circuitry and communication lines for data-error handling, such additions increase the cost of memory.

Thus, with some memory devices, it is advisable to perform error-handling operations on a per-bank basis during a confiscated refresh-pump time interval. This can result in other banks being idle during this scarce time resource. In example implementations as described herein, however, this scarce time resource is utilized more efficiently. To do so, control circuitry of the memory device performs at least one error-handling operation on at least one first bank during a given confiscated refresh-pump time interval and performs at least one UBD mitigation operation on at least one second bank during the same confiscated refresh-pump time interval. A coordination circuit can control the confiscation of a refresh-pump time interval and the assignment (or allocation) of this time resource to at least one bank for error-handling and one or more other banks for UBD mitigation. Example implementations for this approach are described with reference to FIGS. 5-2, 9, 10-1, and 10-2.

In some implementations, each bank (e.g., up to all banks) of a memory IC chip that is not performing an error-handling operation can instead be performing a UBD mitigation operation during a given refresh-pump time interval that has been confiscated from a refresh command. This can result in significantly higher efficiencies and can be applied to all-bank refresh (REFab) command scenarios. In other implementations, with same-bank refresh (REFsb) command scenarios, a certain identified bank in one bank group may be targeted for an error-handling operation while banks with the same bank address in other bank groups are not available for normal access due to the same-bank refresh command. Other banks (e.g., banks with different bank-addressing bit values) in each of the bank groups of the memory chip can remain available for accessing. Accordingly, one or more of the same banks (e.g., banks with the same bank-addressing bit values as the identified bank) across the multiple bank groups are candidates for performing a UBD mitigation operation during the same confiscated refresh-pump time interval in which the identified bank is performing the error-handling operation. These two example implementations are described with reference to FIGS. 10-1 and 10-2.

The memory device can therefore perform multiple operations, including multiple different types of operations, during a single refresh-pump time interval that has been confiscated from a refresh command. These different types of operations can include, for instance, a data-error-handling operation and a UBD mitigation operation. In these manners, the limited time resource provided by confiscated refresh-pump time intervals can be efficiently utilized without relying on further replication or expansion of circuitry, like without increasing the circuitry dedicated to error handling. Further, an error-handling operation and a UBD mitigation operation can be performed generally so as to be at least partly overlapping in time, even if the two types of operations are not fully performed within a single refresh-pump time interval.

In other approaches that are described herein, a memory device can prioritize a UBD mitigation operation over an error-handling operation. Performing UBD mitigation functionality and performing error-handling functionality are both important for some types of memory devices, like DRAM that is intended to be secure and reliable. Both functionalities may also be assigned to use confiscated refresh opportunities. Generally, however, UBD mitigation functionality may be more time-sensitive than error-handling functionality. For example, if a UBD mitigation operation is not performed in a timely manner, an alert condition is created if a row activation count meets a given mitigation threshold. To resolve the alert condition, the memory device stops servicing commands from a host device (e.g., a memory controller) and dedicates resources to performing UBD mitigation operation(s). Thus, the user experience is adversely impacted even if data is not compromised. Further, although a failure to perform UBD mitigation or error handling can result in a loss of data, a failure to timely perform UBD mitigation operations can result in data errors or appreciable service latencies after just seconds, or even after just part of a second if the memory device is under attack. In contrast, there is usually a longer acceptable time horizon for performing error-handling operations.

In some implementations, responsive to confiscating a refresh time interval, control circuitry of a memory device determines if a given bank can forgo a UBD mitigation operation. For example, the control circuitry can compare an activation count of each row of the given bank to at least one mitigation threshold. As described herein, to track how often each row has been activated, an activation count for each row can be incremented responsive to each row access. If no victim row is at risk due to the activation count of an aggressor row, the control circuitry can determine that the given bank can forgo the UBD mitigation operation. In such cases, the control circuitry can assign to the given bank an error-handling operation to perform during the corresponding time interval instead of a UBD mitigation operation. On the other hand, if the risk is too great, the control circuitry causes (e.g., permits or commands) the UBD mitigation operation to be performed. These implementations enable confiscated time resources to be efficiently assigned between at least UBD mitigation functionality and error-handling functionality by prioritizing the functionality that is more time-sensitive in many situations.

If activation counters storing activation counts, or other UBD-mitigation-related circuitry, are positioned near (e.g., proximate to or at) each bank, then the determination of if a given bank can forgo a UBD mitigation operation may be determined remote from a centralized portion of an IC chip that orchestrates some error-handling functionality. In at least some of such cases, a bus can be deployed between a bank-shared coordination circuit and the bank-specific UBD mitigation circuits to communicate the result of the bank-level determinations. In an example implementation, the bus includes sufficient lines to dedicate one line to each bank of the IC chip. This simplifies the bus protocol at the expense of more area, which adds cost to the memory device. In an alternative example implementation, the bus shares one line between two or more banks, and up to all banks, of the IC chip. This reduces the area occupied by the bus, but the protocol can be more complicated. Protocol examples of a bus that uses one line for multiple banks, and as few as a single line for all on-chip banks, are described herein.

Thus, some approaches describe performing at least one error-handling operation in conjunction with one or more UBD mitigation operations during a same time interval. For example, if control circuitry assigns a particular bank a refresh-pump time interval to perform an error-handling operation, the control circuitry can assign one or more other banks the same refresh-pump time interval to respectively perform at least one UBD mitigation operation in each bank. Other approaches describe circuitry that can prioritize the performance of a UBD mitigation operation over the performance of an error-handling operation based, at least partially, on activation counts. These various approaches may, however, be realized by the same memory device to further provide for efficient coordination of error handling and usage-based-disturbance mitigation.

As a first example, control circuitry may determine that a given bank cannot forgo a UBD mitigation operation. In that event, the control circuitry can cause the given bank to perform the UBD mitigation operation during a first time interval while assigning a particular bank to perform an error-handling operation during the first time interval. Moreover, the control circuitry can cause multiple other banks, besides the given bank and the particular bank, to perform a respective UBD mitigation operation during the first time interval. As a second example, control circuitry may determine that the given bank can forgo a UBD mitigation operation for a second time interval. In that event, the control circuitry can cause the given bank to perform an error-handling operation during the second time interval. Meanwhile, the control circuitry can cause multiple other banks, besides the given bank, to perform a respective UBD mitigation operation during the second time interval.

Example Operating Environments

FIG. 1 illustrates, at 100 generally, an example operating environment including an apparatus 102 that can implement aspects of efficient coordination of error handling and usage-based-disturbance mitigation. The apparatus 102 can include various types of electronic devices, including an internet-of-things (IoT) device 102-1, tablet device 102-2, smartphone 102-3, notebook computer 102-4, passenger vehicle 102-5, server computer 102-6, and server cluster 102-7. The server computer 102-6 or the server cluster 102-7 may be part of cloud computing infrastructure, a data center, a portion thereof (e.g., a printed circuit board (PCB)), and so forth. Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, vehicle, drone, industrial equipment, security device, medical device, sensor, or the electronic components thereof. Each type of apparatus can include one or more components to provide computing functionalities or features.

In example implementations, the apparatus 102 can include at least one host device 104, at least one interconnect 106, and at least one memory device 108. The host device 104 can include at least one processor 110, at least one cache memory 112, and at least one memory controller 114. The memory device 108, which can also be realized with a memory module, can include, for example, a dynamic random-access memory (DRAM) die or module (e.g., Low-Power Double Data Rate synchronous DRAM (LPDDR SDRAM)). The DRAM die or module can include a three-dimensional (3D) stacked DRAM device, which may be a high-bandwidth memory (HBM) device or a hybrid memory cube (HMC) device. The memory device 108 can operate as a main memory for the apparatus 102. Although not illustrated, the apparatus 102 can also include storage memory. The storage memory can include, for example, a storage-class memory device (e.g., flash memory, hard disk drive, solid-state drive, phase-change memory (PCM), or memory employing 3D XPoint™).

The processor 110 is operatively coupled to the cache memory 112, which is operatively coupled to the memory controller 114. The processor 110 is also coupled, directly or indirectly, to the memory controller 114. The host device 104 may include other components to form, for instance, a system-on-a-chip (SoC). The processor 110 may include a general-purpose processor, central processing unit, graphics processing unit (GPU), neural network engine or accelerator, application-specific integrated circuit (ASIC), field-programmable gate array (FPGA) integrated circuit (IC), or communications processor (e.g., a modem or baseband processor).

In operation, the memory controller 114 can provide a high-level or logical interface between the processor 110 and at least one memory (e.g., an external memory). The memory controller 114 may be realized with any of a variety of suitable memory controllers (e.g., a double-data-rate (DDR) or synchronous memory controller that can process requests for data stored on the memory device 108). Although not shown, the host device 104 may include a physical interface (PHY) that transfers data between the memory controller 114 and the memory device 108 through the interconnect 106. For example, the physical interface may be an interface that is compatible with a DDR PHY Interface (DFI) Group interface protocol. The memory controller 114 can, for example, receive memory requests from the processor 110 and provide the memory requests to external memory with appropriate formatting, timing, and reordering. The memory controller 114 can also forward to the processor 110 responses to the memory requests (e.g., read data or write confirmation) that are received from external memory.

The host device 104 is operatively coupled, via the interconnect 106, to the memory device 108. In some examples, the memory device 108 is connected to the host device 104 via the interconnect 106 with an intervening buffer or cache. The memory device 108 may operatively couple to storage memory (not shown). The host device 104 can also be coupled, directly or indirectly via the interconnect 106, to the memory device 108 and the storage memory. The interconnect 106 and other interconnects (not illustrated in FIG. 1) can transfer data between two or more components of the apparatus 102. Examples of the interconnect 106 include a bus (e.g., unidirectional bus, bidirectional bus, or memory bus), switching fabric, or one or more wires that carry voltage or current signals. The interconnect 106 can propagate one or more communications 116 between the host device 104 and the memory device 108. For example, the host device 104 may transmit a memory request to the memory device 108 over the interconnect 106. Also, the memory device 108 may transmit a corresponding memory response to the host device 104 over the interconnect 106.

The illustrated components of the apparatus 102 represent an example architecture with a hierarchical memory system. A hierarchical memory system may include memories at different levels, with each level having memory with a different speed or capacity. As illustrated, the cache memory 112 logically couples the processor 110 to the memory device 108. In the illustrated implementation, the cache memory 112 is at a higher level than the memory device 108. A storage memory, in turn, can be at a lower level than the main memory (e.g., the memory device 108). Memory at lower hierarchical levels may have a decreased speed but increased capacity or lower cost relative to memory at higher hierarchical levels. Accordingly, the memory device 108 can form at least part of the main memory of the apparatus 102. Additionally or alternatively, the memory device 108 may form at least part of a cache memory, a storage memory, or a system-on-chip of the apparatus 102.

The apparatus 102 can be implemented in various manners with more, fewer, or different components. For example, the host device 104 may include multiple cache memories (e.g., including multiple levels of cache memory) or no cache memory. In other implementations, the host device 104 may omit the processor 110 or the memory controller 114. A memory (e.g., the memory device 108) may have an "internal" or "local" cache memory. As another example, the apparatus 102 may include cache memory between the interconnect 106 and the memory device 108. Computer engineers can also include any of the illustrated components in distributed or shared memory systems.

Computer engineers may implement the host device 104 and the various memories in multiple manners. In some cases, the host device 104 and the memory device 108 can be disposed on, or physically supported by, a printed circuit board (e.g., a rigid or flexible motherboard). The host device 104 and the memory device 108 may additionally be integrated together on an integrated circuit or fabricated on separate integrated circuits and packaged together. The memory device 108 may also be coupled to multiple host devices 104 via one or more interconnects 106 and may respond to memory requests from two or more host devices 104. Each host device 104 may include a respective memory controller 114, or the multiple host devices 104 may share a memory controller 114.

Thus, this document describes with reference to FIG. 1 an example computing system architecture having at least one host device 104 coupled to a memory device 108. Two or more memory components (e.g., modules, dies, bank groups, or banks) may share the electrical paths or couplings of the interconnect 106 that can extend between the host device 104 and the memory device 108. The interconnect 106 can include at least one command-and-address bus (CA bus) and at least one data bus (DQ bus), which are not separately depicted. The command-and-address bus can transmit addresses and commands from the memory controller 114 of the host device 104 to the memory device 108. In some cases, the command-and-address bus may exclude the propagation of data. The data bus can propagate data between the memory controller 114 and the memory device 108. The memory device 108 may also be implemented as any suitable memory including, but not limited to, DRAM, SDRAM, three-dimensional (3D) stacked DRAM, DDR memory, or LPDDR memory (e.g., LPDDR DRAM or LPDDR SDRAM).

In example implementations, the memory device 108 includes at least one usage-based-disturbance mitigation circuit 120 (UBD mitigation circuit 120), at least one error-handling circuit 122, at least one refresh circuit 124, and at least one coordination circuit 126. The UBD mitigation circuit 120, the error-handling circuit 122, the refresh circuit 124, and the coordination circuit 126 can each be implemented using software, firmware, hardware, fixed logic circuitry, or some combinations thereof. These circuits can be arranged or organized in any manner. For example, two or more circuits can be combined, or one circuit may incorporate or encompass one or more other circuits. For instance, the coordination circuit 126 can be fully or partially integrated within one or more other circuits, such as the refresh circuit 124, or the coordination circuit 126 can be implemented separately.

In example operations, the UBD mitigation circuit 120 mitigates usage-based disturbance for one or more banks that are associated with (e.g., that are part of) the memory device 108 using at least one usage-based-disturbance mitigation operation 130 (UBD mitigation operation 130). This mitigation can include detecting a condition associated with usage-based disturbance, such as the presence of an aggressor row, and initiating a refresh of one or more victim rows associated with the detected condition of the aggressor row. The UBD mitigation circuit 120 can employ various strategies for detecting and mitigating usage-based-disturbance conditions. Example implementations of the UBD mitigation circuit 120 are further described with reference to FIG. 8.

The error-handling circuit 122 handles at least a portion of the error-processing responsibilities for the memory device 108 using at least one error-handling operation 132. These error-processing responsibilities can include monitoring data for errors and noting detected errors. The error-processing responsibilities can also include correcting one or more bit errors responsive to a request for data or repeatedly at certain intervals, such as at least once every twenty-four hours. Further, error-processing responsibilities can include reporting the results of an error detection scheme, such as whether any errors have been detected or corrected, to an external entity, like the memory controller 114. In some cases, the error detection scheme can be supported using error correction code (ECC) technology. Example implementations of the error-handling circuit 122 are further described with reference to FIG. 7.

The refresh circuit 124 controls the refreshing of DRAM cells using at least one refresh operation 134 to ensure data is not lost due to capacitor discharge. The DRAM refreshing can be performed responsive to externally generated refresh commands (e.g., from the memory controller 114) or internally generated refresh commands. In some cases, the refresh circuit 124 determines currently available timing resources that can be confiscated (e.g., appropriated, commandeered, or stolen). For example, instead of performing a refresh operation 134, the memory device 108 can perform at least one UBD mitigation operation 130 or at least one error-handling operation 132, including at least one UBD mitigation operation 130 and at least one error-handling operation 132 during a confiscated refresh opportunity in accordance with a permitted inclusive-or interpretation of the word "or." The refresh circuit 124 can also communicate this information (e.g., the availability of a refresh-pump time interval) to the coordination circuit 126. The available timing resources can represent, for example, a timing or quantity of refreshes (e.g., a quantity of refresh pumps or quantity of refresh pulses) that are available for performing at least one UBD mitigation operation 130 or at least one error-handling operation 132 and that are associated with a current refresh command. Example implementations related to a refresh operation 134, which can be performed by the refresh circuit 124, are further described with reference to FIG. 6.

The coordination circuit 126 can act as an interface between the refresh circuit 124 that possesses (e.g., provides or sources) timing resources and the UBD mitigation circuit 120 and the error-handling circuit 122 that can use (e.g., consume or sink) the timing resources. The coordination circuit 126 may control the assigning of timing resources or the scheduling of actions performed by the UBD mitigation circuit 120 and the error-handling circuit 122 to efficiently utilize available timing resources. For example, if the coordination circuit 126 assigns a confiscated refresh-pump time interval to the error-handling circuit 122 for at least one error-handling operation 132, the coordination circuit 126 can also assign the same confiscated refresh-pump time interval to the UBD mitigation circuit 120 for at least one UBD mitigation operation 130. These two or more operations may be performed in different banks to efficiently utilize per-bank accessing circuitry that is used for reading or writing data bits.

As another example, a UBD mitigation circuit 120 that is associated with a particular bank can determine if a UBD mitigation operation 130 can be skipped for that particular bank. Based on this determination, the coordination circuit 126 can command that particular bank to perform the UBD mitigation operation 130 or to perform an error-handling operation 132 instead. The coordination circuit 126 can further assign one or more other banks to perform other UBD mitigation operations 130 or the error-handling operation 132, depending on the determination by the particular bank. Example implementations of the coordination circuit 126 are further described with reference to FIGS. 5-2, 9, 10-1, 10-2, 12, and 14-17.

Each of these circuits can be implemented at a local-bank level, at a global-bank level (e.g., a global level, a central level, or a chip level), or at a combination of a local-bank level and a global-bank level. This means, for example, that one instance of the coordination circuit 126 that is implemented at the global-bank level can interface with two or more UBD mitigation circuits 120 that are implemented at the local-bank level. Further, the error-handling circuit 122 can be separated into different instances or portions for, or otherwise distributed across, the local-bank level and the global-bank level. Example relationships between the local-bank level and the global-bank level are further described with reference to FIGS. 5-1, 9 and 14. Next, however, other components of the memory device 108 are described with reference to FIG. 2 in the context of an example computing system.

Figure 2:
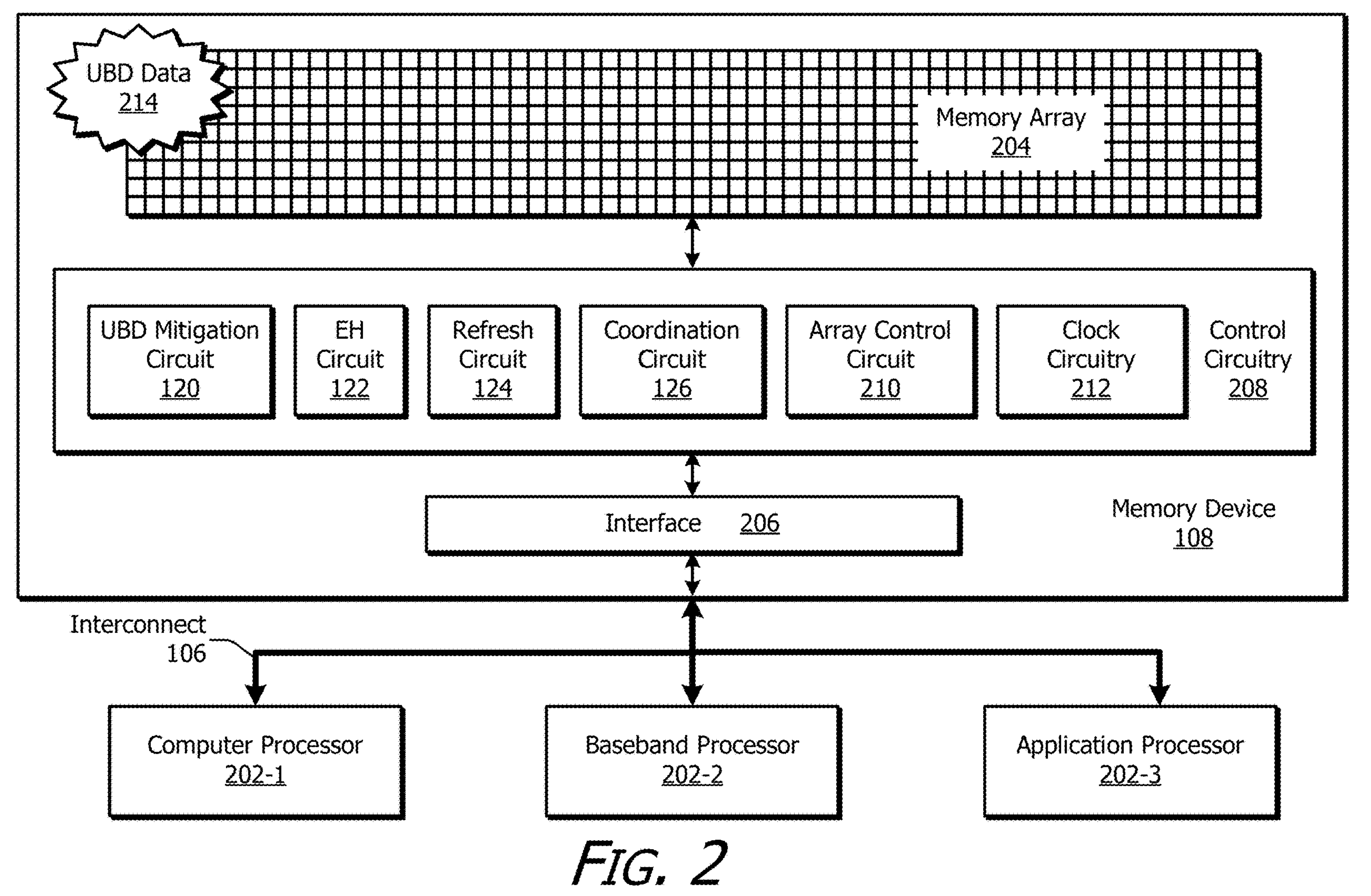
FIG. 2 illustrates example computing systems that can implement aspects of efficient coordination of error handling and usage-based-disturbance mitigation.

FIG. 2 illustrates examples of a computing system 200 that can implement aspects of efficient coordination of error handling and usage-based-disturbance mitigation. In some implementations, the computing system 200 includes at least one memory device 108, at least one interconnect 106, and at least one processor 202. The memory device 108 can include, or be associated with, at least one memory array 204, at least one interface 206, and control circuitry 208 (or periphery circuitry or central circuitry) operatively coupled to the memory array 204. The memory array 204 can include an array of memory cells, including but not limited to memory cells of DRAM, SDRAM, three-dimensional (3D) stacked DRAM, DDR memory, LPDDR SDRAM, and so forth. The memory array 204 and the control circuitry 208 may be components on a single semiconductor die or on separate semiconductor dies. The memory array 204 or the control circuitry 208 may also be distributed across multiple dies. This control circuitry 208 may additionally or alternatively manage traffic on a bus that is separate from the interconnect 106.

The control circuitry 208 can include various components that the memory device 108 can use to perform various operations. These operations can include communicating with other devices, managing memory performance, performing refresh operations (e.g., self-refresh operations or auto-refresh operations), and performing memory read or write operations. In the depicted configuration, the control circuitry 208 includes the UBD mitigation circuit 120, the error-handling circuit 122 (EH circuit 122), the refresh circuit 124, the coordination circuit 126, at least one array control circuit 210, and at least one instance of clock circuitry 212. In some implementations, the UBD mitigation circuit 120, the error-handling circuit 122, the refresh circuit 124, and the coordination circuit 126 are part of the control circuitry 208, as shown in FIG. 2. In other implementations, the UBD mitigation circuit 120, the error-handling circuit 122, the refresh circuit 124, the coordination circuit 126, or some combination thereof are considered at least partly separate from the control circuitry 208 from a logical or physical perspective.

The array control circuit 210 can include circuitry that provides command decoding, address decoding, input/output functions, amplification circuitry, power supply management, power control modes, and other functions. The clock circuitry 212 can synchronize various memory components with one or more external clock signals provided over the interconnect 106, including a command-and-address clock or a data clock. The clock circuitry 212 can also include an internal clock generator or use an internal clock signal to synchronize memory components. The clock circuitry may further provide timer functionality.

The UBD mitigation circuit 120 can be coupled to a set of memory cells within the memory array 204 that store usage-based-disturbance data 214 (UBD data 214). The usage-based-disturbance data 214 can include information such as an activation count, which represents a quantity of times one or more rows within the memory array 204 have been activated (or accessed) by the memory device 108. In example implementations, each row of the memory array 204 includes a subset of memory cells that stores the usage-based-disturbance data 214 associated with that row, which is further described with reference to FIG. 3. The error-handling circuit 122 can be coupled to any row of multiple rows of the memory array 204. Although not shown in FIG. 2, the memory array 204 can include codewords (e.g., with data bits and check bits) that are used by the error-handling circuit 122 to perform error-handling operations, which are described below with reference to FIG. 7.

The interface 206 can couple the control circuitry 208 or the memory array 204 directly or indirectly to the interconnect 106. In some implementations, the UBD mitigation circuit 120, the error-handling circuit 122, the refresh circuit 124, the coordination circuit 126, the array control circuit 210, and the clock circuitry 212 can be part of a single component (e.g., the control circuitry 208). In other implementations, one or more of the UBD mitigation circuit 120, the error-handling circuit 122, the refresh circuit 124, the coordination circuit 126, the array control circuit 210, or the clock circuitry 212 may be implemented as separate components, which can be provided on a single semiconductor die or disposed across multiple semiconductor dies. These components may individually or jointly couple to the interconnect 106 via the interface 206.

The interconnect 106 may use one or more of a variety of interconnects that communicatively couple together various components and enable commands, addresses, or other information and data to be transferred between two or more components (e.g., between the memory device 108 and a processor 202). Although the interconnect 106 is illustrated with a single line in FIG. 2, the interconnect 106 may include at least one bus, at least one switching fabric, one or more wires or traces that carry voltage or current signals, at least one switch, one or more buffers, and so forth. Further, the interconnect 106 may be separated into at least a command-and-address bus and a data bus.

In some aspects, the memory device 108 may be a "separate" component relative to the host device 104 (of FIG. 1) or any of the processors 202. The separate components can include a printed circuit board, memory card, memory stick, memory module (e.g., a single in-line memory module (SIMM) or dual in-line memory module (DIMM)), or memory integrated circuit, just to name a few examples. Separate physical components may be located together within the same housing of an electronic device or may be distributed over a server rack, a data center, and so forth. Alternatively, the memory device 108 may be integrated with other physical components, including the host device 104 or the processor 202, by being combined on a printed circuit board or combined in a single package or a system-on-chip.

As shown in FIG. 2, the processors 202 may include a computer processor 202-1, a baseband processor 202-2, and an application processor 202-3, which are coupled to the memory device 108 through the interconnect 106. The processors 202 may include or form a part of a central processing unit (CPU), graphics processing unit (GPU), system-on-chip (SoC), application-specific integrated circuit (ASIC), or field-programmable gate array (FPGA). In some cases, a single processor can comprise multiple processing resources, each dedicated to different functions (e.g., modem management, applications, graphics, central processing). In some implementations, the baseband processor 202-2 may include or be coupled to a modem (not illustrated in FIG. 2) and referred to as a modem processor. The modem or the baseband processor 202-2 may be coupled wirelessly to a network via, for example, cellular, Wi-Fi®, Bluetooth®, near field, or another technology or protocol for wireless communication.

In some implementations, the processors 202 may be connected directly to the memory device 108 (e.g., via the interconnect 106). In other implementations, one or more of the processors 202 may be indirectly connected to the memory device 108 (e.g., over a network connection or through one or more other devices). Examples of the memory array 204 are further described with reference to FIG. 3.

FIG. 3 illustrates example approaches to storing data within rows of a memory array 204 to support usage-based-disturbance mitigation. As illustrated, the memory array 204 includes multiple rows 302 of memory cells. For example, the memory array 204 can include rows 302-1, 302-2, . . . , 302-R, where R represents a positive integer. Each row 302 is respectively associated with an address 304 (e.g., a row address, a memory row address, or a memory address) of multiple addresses 304-1, 304-2, . . . , 304-R. For example, a first row 302-1 has a first address 304-1, a second row 302-2 has a second address 304-2, and an $R^{th}$ row 302-R has an $R^{th}$ address 304-R.

Each of the rows 302 can store normal data 306 within a first subset of the memory cells associated with that row 302. The normal data 306 represents data that is read from or written to the memory device 108 during normal memory input/output operations (e.g., during normal read or write operations for user data) and may further include check bits generated by an error handling circuit as a mechanism to detect or correct errors in user data as described below with reference to FIG. 7. The normal data 306, for example, can include data that is transmitted by the memory controller 114 and is written to one or more rows 302 of the memory array 204.

In example implementations, in addition to the normal data 306, each of the rows 302 can store usage-based-disturbance data 214 within a second subset of the memory cells associated with that row 302. The usage-based-disturbance data 214 includes information that enables the UBD mitigation circuit 120 to mitigate the potential effects of usage-based disturbance. In example aspects, the usage-based-disturbance data 214 includes an activation count 308. With the activation count 308, the memory device 108 can keep track of a quantity of accesses or activations of the corresponding memory row 302. In some example implementations, the usage-based-disturbance data 214 can also include a count of how many times a neighboring row (e.g., an adjacent or other proximate row) is refreshed in order to mitigate usage-based disturbance. Each of these counts provide an example mechanism by which the memory device 108 can monitor for usage-based disturbance and determine when to refresh victim rows to reduce the risk of usage-based disturbance corrupting data.

In the example shown in FIG. 3, the first row 302-1 stores first normal data 306-1 within a first subset of memory cells of the first row 302-1 and stores first usage-based-disturbance data 214-1 within a second subset of memory cells of the first row 302-1. The first usage-based-disturbance data 214-1 includes a first activation count 308-1, which represents a quantity of times the first row 302-1 has been activated since a last refresh. As another example, the second row 302-2 stores second normal data 306-2 within a first subset of memory cells within the second row 302-2 and stores second usage-based-disturbance data 214-2 within a second subset of memory cells within the second row 302-2. The second usage-based-disturbance data 214-2 includes a second activation count 308-2, which represents a quantity of times the second row 302-2 has been activated since a last refresh. Additionally, the $R^{th}$ row 302-R stores $R^{th}$ normal data 306-R within a first subset of memory cells within the $R^{th}$ row 302-R and stores $R^{th}$ usage-based-disturbance data 214-R within a second subset of memory cells within the $R^{th}$ row 302-R. The $R^{th}$ usage-based-disturbance data 214-R includes an $R^{th}$ activation count 308-R, which represents a quantity of times the $R^{th}$ row 302-R has been activated since a last refresh.

The usage-based-disturbance data 214 can also include information or can be formatted (e.g., coded) in such a way as to support error detection. In this example, the usage-based-disturbance data 214 includes a parity bit 310. In particular, the usage-based-disturbance data 214-1, 214-2, and 214-R respectively includes a parity bit 310-1, 310-2, and 310-R. Other implementations are also possible in which the usage-based-disturbance data 214 is coded in a manner that supports any given error detection test, such as an error-correcting-code (ECC) check. The parity bit 310, or other check bit(s) that are stored as part of the usage-based-disturbance data 214, can be used to check the accuracy or correctness of the activation count 308. Although techniques for detecting a condition associated with usage-based disturbance are primarily described herein with respect to using an activation count 308, these techniques can be applied generally to detecting a condition based on any type of information that is represented by the usage-based-disturbance data 214, including error-detection techniques. Other error-detection techniques, including data that can be stored differently, are described below with reference to FIG. 7.

Figure 4:
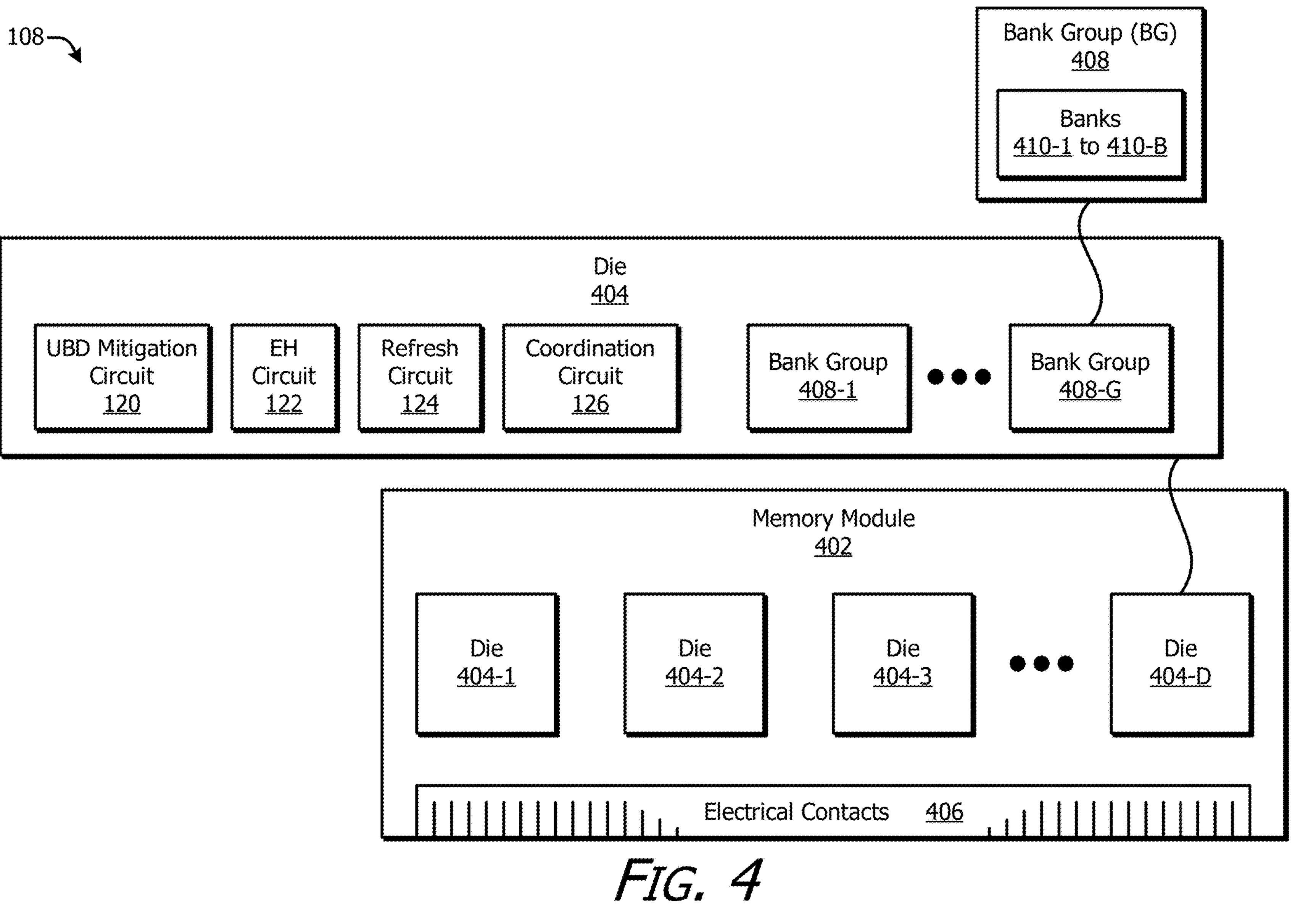
FIG. 4 illustrates an example memory device in which aspects of efficient coordination of error handling and usage-based-disturbance mitigation can be implemented.

FIG. 4 illustrates an example memory device 108 in which aspects of efficient coordination of error handling and usage-based-disturbance mitigation can be implemented. As shown, the memory device 108 includes a memory module 402, which can include multiple dies 404. As illustrated, the memory module 402 includes a first die 404-1, a second die 404-2, a third die 404-3, and a $D^{th}$ die 404-D, with D representing a positive integer. The memory module 402 can be a SIMM or a DIMM, for instance. As another example, the memory module 402 can interface with other components via a bus interconnect (e.g., a Peripheral Component Interconnect Express (PCIe®) bus). The memory device 108 illustrated in FIGS. 1 and 2 can correspond, for example, to a die 404, to multiple dies (or dice) 404-1 through 404-D, or to a memory module 402 with two or more dies 404. As shown, the memory module 402 can include one or more electrical contacts 406 (e.g., pins) to interface the memory module 402 to other components.

The memory module 402 can be implemented in various manners. For example, the memory module 402 may include a printed circuit board, and the multiple dies 404-1 through 404-D may be mounted or otherwise attached to the printed circuit board. The dies 404 (e.g., memory dies) may be arranged in a line or along two or more dimensions (e.g., forming a grid or array). The dies 404 may have a similar size to each other or may have different sizes. Generally, each die 404 may be similar to another die 404 or may be different in size, shape, data capacity, or control circuitries. The dies 404 may also be positioned on a single side or on multiple sides of the memory module 402.

In example implementations, one or more of the dies 404-1 to 404-D include the UBD mitigation circuit 120, the error-handling circuit 122, the refresh circuit 124, the coordination circuit 126, and multiple bank groups 408-1 . . . 408-G, with G representing a positive integer. Each bank group 408 includes at least two banks 410, such as multiple banks 410-1 . . . 410-B, with B representing a positive integer. In some implementations, the die 404 includes multiple instances of the UBD mitigation circuit 120, each of which mitigates usage-based-disturbance across at least one of the banks 410. The die 404 also includes multiple instances of the error-handling circuit 122, each of which performs the error-handling operations for at least one respective corresponding bank 410. The coordination circuit 126 coordinates the scheduling, timings, or locations of the UBD mitigation operations 130 and the error-handling operations 132 across two or more banks. Generally, a given circuit can operate with respect to a single bank 410, multiple banks 410-1 to 410-B of a single bank group 408 (e.g., up to all banks of the bank group), multiple banks distributed across two or more bank groups, a single bank group 408, multiple bank groups 408-1 to 408-G, all banks on an IC chip (and thus all bank groups, if present), and so forth.

Various implementations of the refresh circuit 124 are also possible. In a first example, the die 404 includes a single refresh circuit 124 that is coupled to the one or more instances of the coordination circuit 126. In a second example, the die 404 includes multiple instances of the refresh circuit 124 that are coupled to one or more instances of the coordination circuit 126. In the first example, the refresh circuit 124 can correspond to all banks on an IC chip. In the second example, each refresh circuit 124 can respectively correspond to a single bank 410, multiple banks 410-1 to 410-L (where L is less than B), a single bank group 408, multiple bank groups 408-1 to 408-G, and so forth. Example relationships between the banks 410-1 to 410-B, the UBD mitigation circuit 120, the error-handling circuit 122, the refresh circuit 124, and the coordination circuit 126 are further described with reference to FIGS. 5-1 and 5-2, as well as FIGS. 9, 10-1, 10-2, and 12 to 17.

Example Techniques and Hardware

Figures 1, 5:
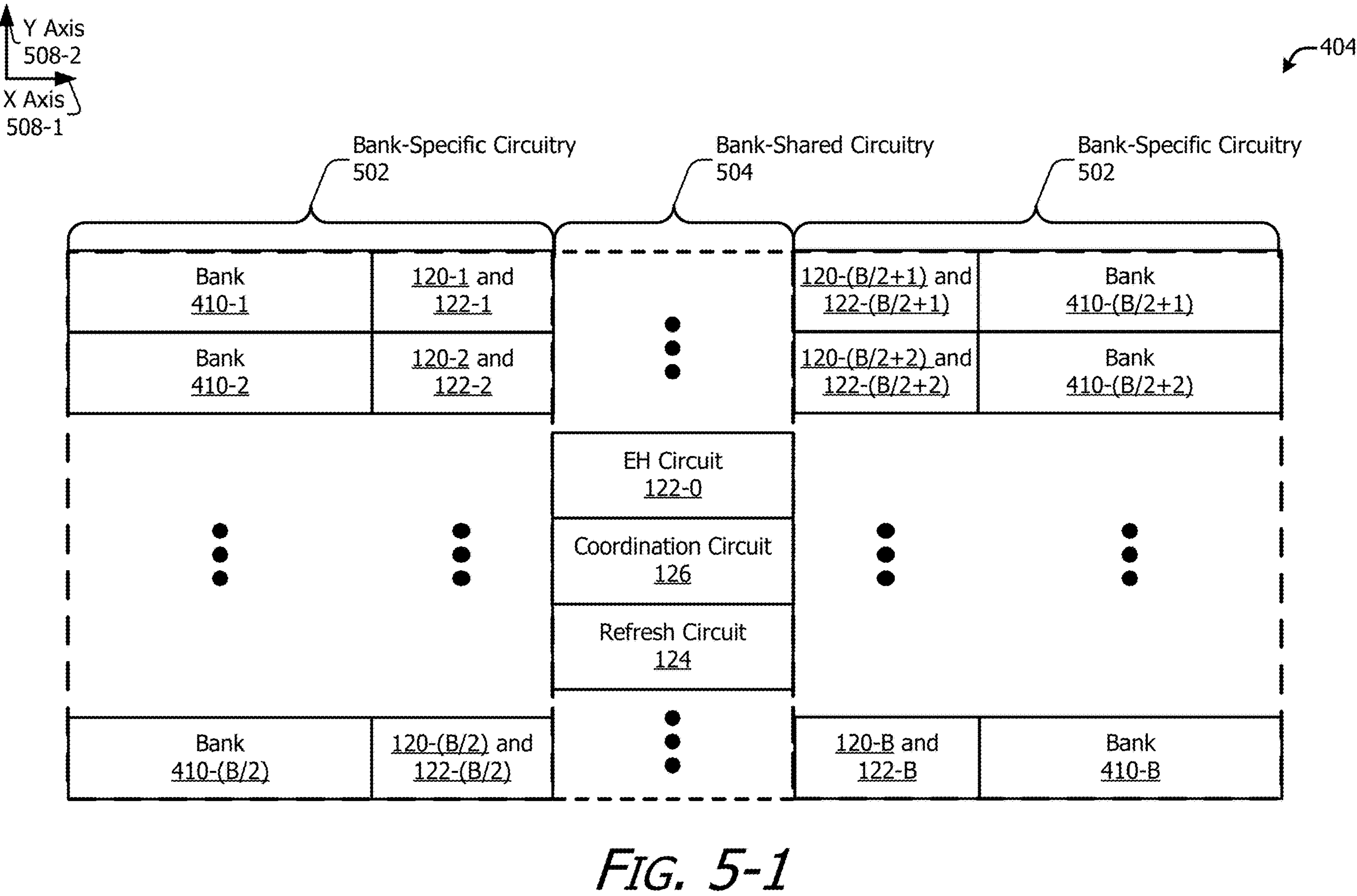
Figures 2, 5:
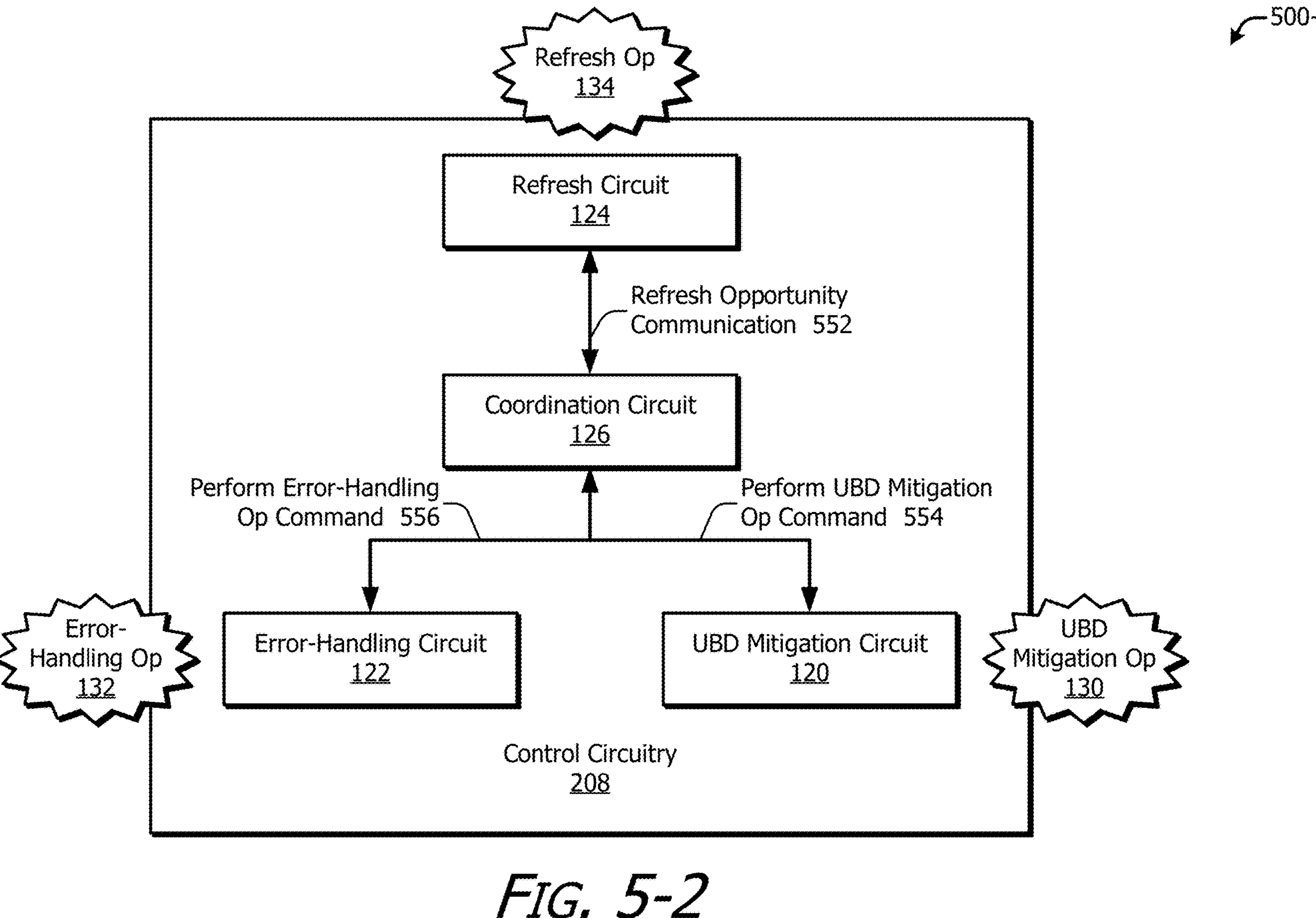

FIG. 5-1 illustrates an example arrangement of circuits that can implement aspects of efficient coordination of error handling and usage-based-disturbance mitigation on a die 404. As shown, the die 404 can include multiple instances of the UBD mitigation circuit 120 and multiple instances of the error-handling circuit 122. In example implementations, the die 404 includes bank-specific circuitry 502 and bank-shared circuitry 504. Bank-specific circuitry 502 includes components that are associated with a particular bank 410. For example, the bank-specific circuitry 502 includes the banks 410-1, 410-2, . . . , 410-(B/2), 410-(B/2+1),

410-(B/2+2), . . . , 410-B; the UBD mitigation circuits 120-1, 120-2, . . . , 120-(B/2), 120-(B/2+1), 120-(B/2+2), . . . , 120-B; and the error-handling circuits 122-1, 122-2, . . . , 122-(B/2), 122-(B/2+1), 122-(B/2+2), . . . , 122-B.

The UBD mitigation circuits 120-1 to 120-B and the error-handling circuits 122-1 to 122-B are respectively coupled to the banks 410-1 to 410-B. In some cases, subsets of the banks 410-1 to 410-B are associated with different bank groups 408 (e.g., of FIGS. 4, 10-1, and 10-2). For example, the die 404 can include 32 banks 410-1 . . . 410-B (e.g., B equals 32 in this example). The 32 banks 410-1 to 410-B can form eight bank groups 408-1 . . . 408-G (e.g., G equals 8 in this example), with each bank group 408 therefore including four of the banks 410. In other cases, the banks 410-1 to 410-B may be part of, or otherwise associated with, a single bank group 408, or the memory die may have no organization by bank group.

The bank-shared circuitry 504 includes components that are associated with multiple banks 410, such as two or more banks. These components can perform operations or provide instructions or commands that are associated with multiple banks 410. Example components of the bank-shared circuitry 504 include at least one error-handling circuit 122-0, the at least one refresh circuit 124, and the at least one coordination circuit 126. In some architectures, the bank-shared circuitry 504 can be positioned on an IC chip in a centralized portion of the chip. For instance, the bank-shared circuitry 504 can be positioned between two or more banks to facilitate having signaling pathways to the multiple banks with lengths that are more equal than if the bank-shared circuitry 504 were positioned on a far side of the multiple banks.

Further, on the die 404, the bank-specific circuitry 502 can be positioned on two (or more) opposite sides of the bank-shared circuitry 504. Explained another way, the bank-shared circuitry 504 can be centrally positioned on the die 404. As such, the error-handling circuit 122-0, the refresh circuit 124, and the coordination circuit 126 can be positioned closer to the center of the die 404 as compared to the edges of the die 404. Positioning the bank-shared circuitry 504 in the center enables signal routing between the bank-shared circuitry 504 and the bank-specific circuitry 502 to be simplified, shortened, or better equalized.

In some implementations, the error-handling circuit 122 can be organized into different circuitries. For example, at least one bank-shared circuit instance for error handling, which is identified as the error-handling circuit 122-0, can provide centralized control at a global-bank-level. This bank-shared error-handling circuit 122-0 can report error-processing results to support error handling at the global or bank-shared level. Multiple bank-specific circuit instances for error handling are identified as the multiple error-handling circuits 122-1 to 122-B. Each bank-specific error-handling circuit 122-*x* of the multiple error-handling circuits 122-1 to 122-B can be associated with a respective bank 410-*x* of the multiple banks 410-1 to 410-B. In such cases, the respective error-handling circuit 122-*x* can be disposed physically proximate to the respective bank 410-*x* or can be responsible for performing error-handling operations 132 on the respective bank 410-*x* (including both in an interpretation of "or" as being an "inclusive-or," which interpretation is permitted herein). Examples of these organizations and operations for at least one error-handling circuit 122 are described below with reference to FIG. 7. Similarly, in the architecture of FIG. 5-1, each respective UBD mitigation circuit 120 that corresponds to a respective bank can be referred to as a bank-specific usage-based-disturbance mitigation circuit 120-*x*.

Consider a first axis 508-1 (e.g., the X axis 508-1) and a second axis 508-2 (e.g., the Y axis 508-2), which is perpendicular to the first axis 508-1. In FIG. 5-1, the first axis 508-1 is depicted as a "horizontal" axis, and the second axis 508-2 is depicted as a "vertical" axis. Components of the bank-shared circuitry 504 are distributed across the second axis 508-2. A first set of the banks (e.g., banks 410-1 to 410-(B/2)) are arranged along the second axis 508-2 on a "left" side (as depicted) of the bank-shared circuitry 504. A second set of the banks (e.g., banks 410-(B/2+1) to 410-B) are arranged along the second axis 508-2 on a "right" side of the bank-shared circuitry 504. The UBD mitigation circuits 120-1 to 120-B and the error-handling circuits 122-1 to 122-B are positioned between the corresponding banks 410-1 to 410-B and the bank-shared circuitry 504. By positioning the bank-shared error-handling circuit 122-0 and the coordination circuit 126 in a centralized location between the UBD mitigation circuits 120-1 to 120-B and the error-handling circuits 122-1 to 122-B, this architecture makes routing signal paths easier between the error-handling circuit 122-0 and the coordination circuit 126 of the bank-shared circuitry 504 and the various circuits of the bank-specific circuitry 502. The principles for efficient coordination of error handling and usage-based-disturbance mitigation, however, can be implemented in alternative architectures.

FIG. 5-2 illustrates an example communication scheme 500-2 between two or more circuits that can implement aspects of efficient coordination of error handling and usage-based-disturbance mitigation. As shown, the control circuitry 208 includes at least one UBD mitigation circuit 120, at least one error-handling circuit 122, at least one refresh circuit 124, and at least one coordination circuit 126. These circuits can be organized (e.g., combined, separated, or integrated) or positioned on an integrated circuit in any of the various manners described herein or in alternative manners.

In example implementations, the refresh circuit 124 can perform one or more refresh operations 134 based on at least one refresh command. The refresh circuit 124 can identify at least one refresh opportunity that is to be confiscated or is a candidate for confiscation. The refresh circuit 124 sends a refresh opportunity communication 552 to the coordination circuit 126 to indicate the confiscated refresh opportunity, which may include at least one refresh-pump time interval. Alternatively, the refresh opportunity communication 552 can indicate multiple refresh opportunities (e.g., up to all possible refresh-pump time intervals), and the coordination circuit 126 can select one or more refresh-pump time intervals for confiscation for other use(s) besides memory refreshing.

The coordination circuit 126 assigns a confiscated refresh-pump time interval to at least one bank for error-handling functionality and to one or more banks for usage-based-disturbance mitigation functionality. In some cases, the coordination circuit 126 can enable the UBD mitigation circuit 120 and the error-handling circuit 122 to share a refresh-pump time interval by assigning each circuit one or more different banks for the two respective functionalities. This increases the efficient utilization of the limited temporal resource of refresh opportunities.

In example operations, the coordination circuit 126 transmits to the UBD mitigation circuit 120 a perform UBD mitigation operation command 554, which indicates one or more banks 410 to target. The UBD mitigation circuit 120 receives the perform UBD mitigation operation command 554 from the coordination circuit 126 and performs at least one UBD mitigation operation 130 on the one or more indicated banks 410. Example aspects of performing a UBD mitigation operation 130 are described below with reference to FIG. 8.

Further, the coordination circuit 126 transmits to the error-handling circuit 122 a perform error-handling operation command 556, which indicates at least one bank 410 to target. The error-handling circuit 122 receives the perform error-handling operation command 556 from the coordination circuit 126 and performs at least one error-handling operation 132 on the at least one indicated bank 410. Example aspects of performing an error-handling operation 132 are described below with reference to FIG. 7. Prior to that, however, refresh opportunities are described with reference to FIG. 6.

With at least partial centralized control, the coordination circuit 126 can assign different banks, or different sets of banks, to the UBD mitigation circuit 120 for the at least one UBD mitigation operation 130 and to the error-handling circuit 122 for at least one error-handling operation 132. In one alternative example, the error-handling circuit 122 (e.g., as described above with respect to a bank-shared error-handling circuit 122-0) can incorporate the coordination circuit 126. In another alternative example, the error-handling circuit 122 can select a bank for performing the error-handling operation 132 and indicate the selected bank to the UBD mitigation circuit 120. Accordingly, the UBD mitigation circuit 120 can determine on which one or more banks to perform a UBD mitigation operation 130 without interfering with the error-handling operation 132 on the selected bank. Other alternatives can also be implemented, such as distributed or bank-level determinations for targeted banks, which determinations are then forwarded to another bank for additional decision-making.

Figure 6:
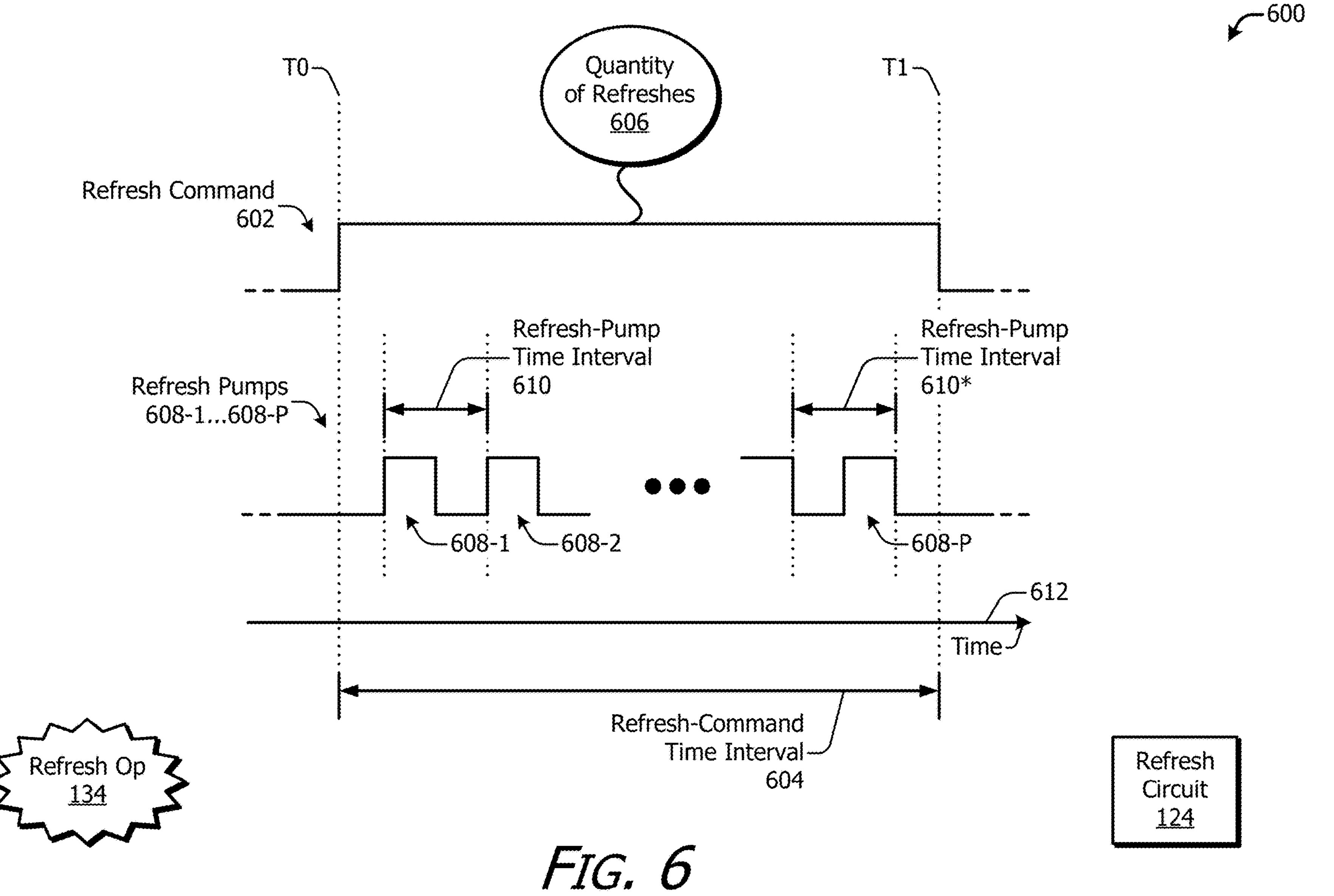
FIG. 6 illustrates aspects of an example refresh command that results in one or more refresh pumps for a refresh operation.

FIG. 6 illustrates, generally at 600, aspects of an example refresh command 602 that results in one or more refresh pumps for a refresh operation 134. As shown, a horizontal axis 612 indicates that time elapses "rightward" in the direction of the arrow. The refresh command 602 can at least partially establish a refresh-command time interval 604. For instance, a length of time during which the refresh command 602 is asserted can correspond to the refresh-command time interval 604. Multiple refresh pumps 608-1, 608-2, . . . , 608-P can be performed during the refresh-command time interval 604, with P representing a positive integer.

In example implementations, the refresh command 602 can be received at the refresh circuit 124 (e.g., also of FIGS. 1, 2, 4, 5-2, and 12). Between times T0 and T1, the refresh command 602 enables at least one row 302 within at least one bank 410 (e.g., of FIGS. 3, 4, and 5-1) to be refreshed. In some cases, the refresh command 602 enables multiple rows 302 within a bank 410 to be refreshed. The refresh-command time interval 604 is associated with the refresh command 602 (e.g., the time between T0 and T1), and the refresh-command time interval 604 enables a particular quantity of refreshes 606 to be performed in series or sequentially. The timing for performing a refresh is indicated (or controlled) by a refresh pump 608, which is generated by the refresh circuit 124. The refresh pump 608 can alternatively be referred to as a refresh pulse. The term "refresh" can also be referred to as a row refresh or a refresh operation. Generally speaking, the quantity P of refresh pumps 608-1 to 608-P available for each refresh command 602 can vary depending on a duration of the refresh-command time interval 604 and/or a refresh mode of the memory device 108.

Example types of refresh commands 602 can include a refresh management (RFM) command, a self-refresh command, an auto-refresh command, a normal refresh command, or any other command relating to refreshing at least one row 302 in a bank 410. Depending on the type of refresh command 602, some of the refresh pumps 608-1 to 608-P associated with the refresh command 602 can be dedicated to normal refresh operations and thus are unavailable for mitigating usage-based disturbance. Additionally or alternatively, some or all of the refresh pumps 608-1 to 608-P can be available for mitigating usage-based disturbance or handling potential or actual errors. It is also possible that some of the refresh pumps 608-1 to 608-P associated with the refresh command 602 are previously postponed refresh pumps. For the techniques described herein, the relevant refresh command 602 is considered to have at least one refresh pump 608 that is available for mitigating usage-based disturbance or handling data errors.

To efficiently utilize one or more available refresh pumps 608-1 to 608-P for usage-based-disturbance mitigation or handling data errors, the refresh circuit 124 and the coordination circuit 126 can communicate in a manner that enables the coordination circuit 126 to assign one or more of the refresh pumps 608-1 to 608-P to the UBD mitigation circuit 120 for at least one UBD mitigation operation 130 or to the error-handling circuit 122 for at least one error-handling operation 132. This can include assigning at least one refresh pump 608 to the UBD mitigation circuit 120 and to the error-handling circuit 122 for efficient use of the scare refresh period resources.

In example aspects, a refresh pump 608 can at least partially establish a refresh-pump time interval 610. For instance, a duration of the refresh pump 608 can correspond to the refresh-pump time interval 610. In the depicted example, a refresh-pump time interval 610 corresponds to consecutive rising edges of two refresh pumps. However, any two corresponding consecutive points or times (e.g., two consecutive falling edges as shown at 610*) can define a refresh-pump time interval 610. Further, a refresh-pump time interval 610 can alternatively correspond to a duration during which a refresh pump 608 is asserted (e.g., half a length of the depicted refresh-pump time interval 610).

As described herein, a UBD mitigation circuit 120 can perform at least one UBD mitigation operation 130 and an error-handling circuit 122 can perform at least one error-handling operation 132 during an assigned refresh-pump time interval 610. In some cases, the performance of the UBD mitigation operation 130 and the error-handling operation 132 during the refresh-pump time interval 610 can overlap in time at least partially. In other cases, although the UBD mitigation operation 130 and the error-handling operation 132 are each performed during an assigned refresh-pump time interval 610, the two operations may not overlap.

Further, in some example aspects, only one operation type or neither one of the UBD mitigation operation 130 and the error-handling operation 132 may be performed fully within an assigned refresh-pump time interval 610. For instance, at least one of the operations may be started during one refresh-pump time interval 610 but completed during another refresh-pump time interval 610 (e.g., the immediately following refresh-pump time interval 610). In other example aspects, a UBD mitigation operation 130 and an error-handling operation 132 may be performed so as to be at least partially overlapping without regard to (e.g., independently of) a refresh pump 608 or a corresponding refresh-pump time interval 610.

Figure 7:
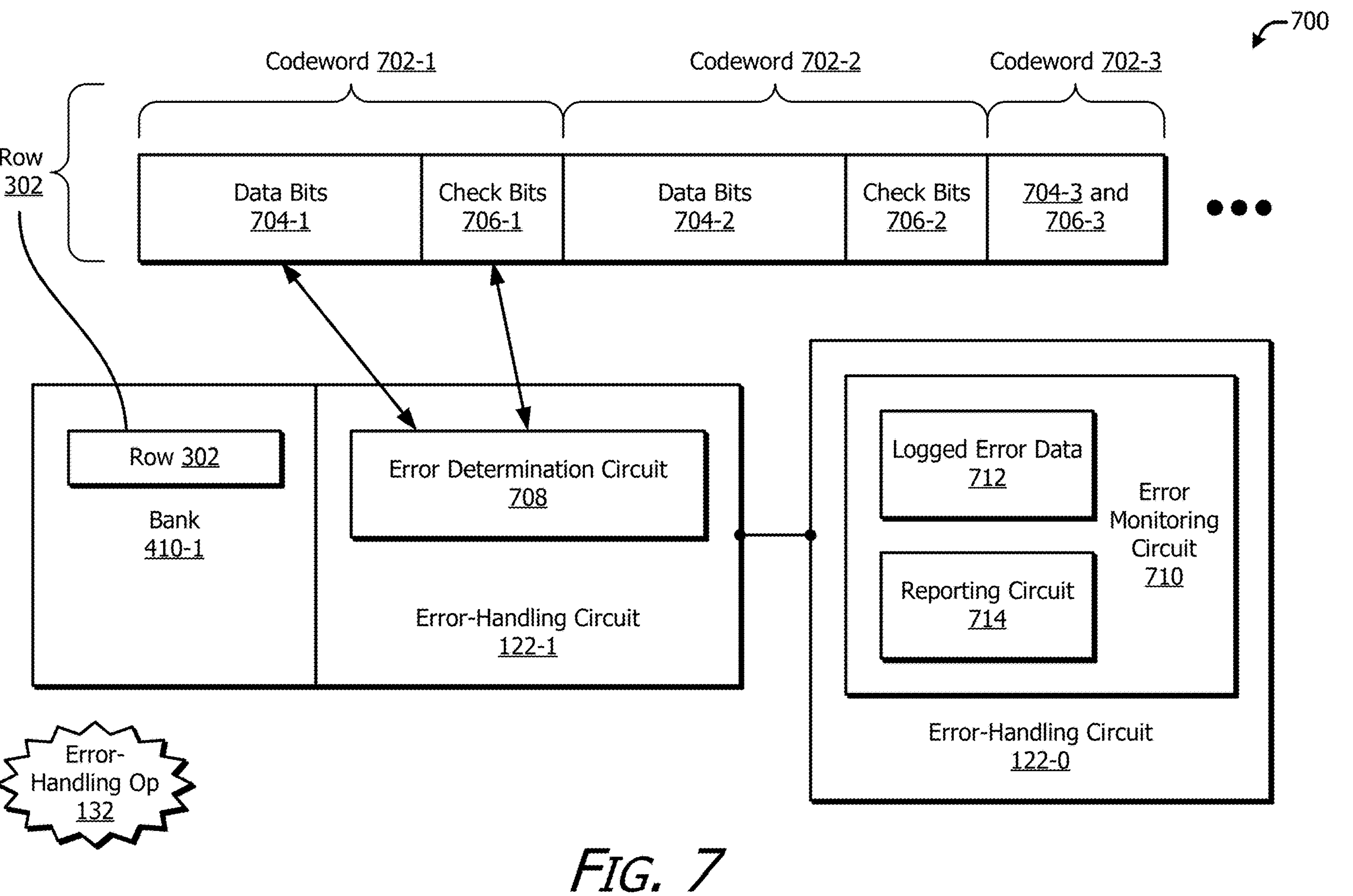
FIG. 7 illustrates aspects of an example error-handling operation that is performed by an example error-handling circuit.

FIG. 7 illustrates, generally at 700, aspects of an example error-handling operation 132 that is performed by an example error-handling circuit 122 to provide example error-handling functionality. As shown, the error-handling circuit 122 can be logically or physically separated into at least two portions. A first portion is an error-handling circuit 122-1 that corresponds to, or is otherwise associated with, a bank 410-1 (e.g., also of FIGS. 4, 5-1, 9, 10-1, 10-2, and 14 to 16) and may be referred to as a bank-specific error-handling circuit 122-1 that is associated with the bank-specific circuitry 502 (of FIG. 5). A second portion is an error-handling circuit 122-0 that corresponds to multiple banks 410-1 to 410-B and may be referred to as a bank-shared error-handling circuit 122-0 that is associated with the bank-shared circuitry 504. Further, the bank-specific error-handling circuit 122-1 can include an error determination circuit 708, and the bank-shared error-handling circuit 122-0 can include an error monitoring circuit 710.

In example implementations, a row 302 includes multiple codewords 702-1, 702-2, 702-3, and so forth. Each code codeword 702 includes multiple data bits 704 and multiple check bits 706 corresponding thereto that are computed using some error-checking paradigm. Thus, a first codeword 702-1 includes first data bits 704-1 (or a first set of multiple data bits 704-1) and first check bits 706-1 (or a first set of multiple check bits 706-1). A second codeword 702-2 includes second data bits 704-2 and second check bits 706-2, and a third codeword 702-3 includes third data bits 704-3 and third check bits 706-3. Although only three codewords 702-1 to 702-3 are explicitly shown, a row 302 may have more or fewer codewords. Further, the bits of the multiple codewords may be organized differently from the depicted example of FIG. 7. For example, the multiple check bits 706 may be placed "before" the corresponding multiple data bits 704. Additionally or alternatively, one or more sets of check bits may be co-located together on the row 302 and placed at any position (e.g., together at the end of the row).

An example error-checking paradigm is an error correction code (ECC) or error correcting code (ECC) scheme, such as one using a block code. Examples of block codes include Reed-Solomon coding and Hamming codes. However, other block codes or another error-checking paradigm may alternatively or additionally be employed. Thus, one or more bit errors in the multiple data bits 704 may be detected using a computation or operation involving the multiple data bits 704 and the multiple check bits 706. Further, the error-checking scheme may be able to detect and correct one or more bit errors in the multiple data bits 704. For instance, a given error-checking scheme and selected quantity of check bits 706 may be able to detect three bit errors or to detect and correct two bit errors in the corresponding multiple data bits 704. By way of example only, the multiple data bits 704 may have a quantity of 64 bits, and the multiple check bits 706 may have a quantity of 8 bits, which produces a codeword 702 having 72 bits.

In example operations, the error-handling circuit 122-1 can perform at least one error-handling operation 132 on at least one codeword 702. For instance, the error determination circuit 708 can perform an error-checking procedure on multiple data bits 704 using the corresponding multiple check bits 706 after reading or loading the codeword 702. If the error determination circuit 708 detects an error, and the error is of a correctable length, the error determination circuit 708 can use the multiple check bits 706 to compute multiple corrected data bits 704 and write or store the multiple corrected data bits 704 back into the row 302. In some cases, such as with memory that operates in accordance with certain ECS principles, the error determination circuit 708 can perform this error-checking procedure on each codeword 702 of the memory within a prescribed time period, such as each 24 hours. Additionally or alternatively, the error determination circuit 708 can perform an error-checking procedure responsive to some event, such as a read request for the multiple data bits 704, a refresh command for the row 302, and so forth.

The error-handling circuit 122-0 can expand the error-handling operation 132 (or perform another error-handling operation 132) that involves monitoring the results of error-checking procedures. For example, the error monitoring circuit 710 can log error data 712 (as logged error data 712). The logged error data 712 can include information regarding any detected error, such as the address of the multiple data bits 704, a quantity of detected bit errors over time or for a particular row or bank, whether the error was corrected, and so forth. Generally, the error monitoring circuit 710 can operate in accordance with an ECS standard, and the logged error data 712 can comport with the corresponding reporting specifications of the ECS standard. Further, the error monitoring circuit 710 can include a reporting circuit 714. The reporting circuit 714 can report the logged error data 712 in response to an external inquiry or command or based on a setting (e.g., in a memory register) for the report timing.

Figure 8:
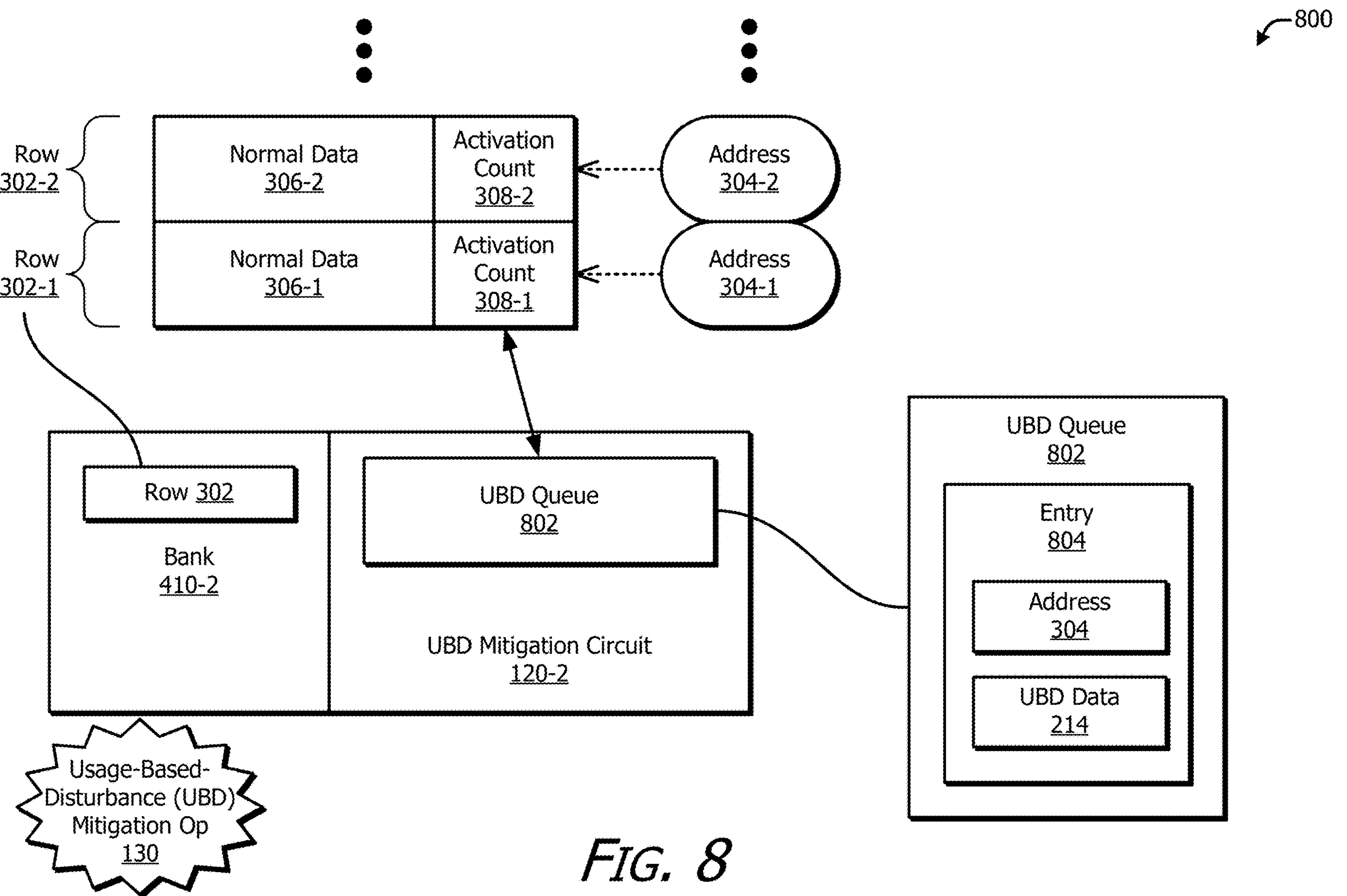
FIG. 8 illustrates aspects of an example usage-based-disturbance mitigation operation that is performed by an example usage-based-disturbance mitigation circuit.

FIG. 8 illustrates, generally at 800, aspects of an example usage-based-disturbance mitigation operation 130 that is performed by an example usage-based-disturbance mitigation circuit 120 to provide example usage-based-disturbance mitigation functionality. As shown, a UBD mitigation circuit 120-2 corresponds to, or is otherwise associated with, a bank 410-2 (e.g., also of FIGS. 4, 5-1, 9, 10-1, 10-2, and 14 to 16). In example implementations, the UBD mitigation circuit 120-2 can include a usage-based-disturbance queue 802 (UBD queue 802) to facilitate performing the UBD mitigation operation 130. The usage-based-disturbance queue 802 can include multiple entries, such as an entry 804. Each entry 804 can include an address 304 (e.g., at least a row address) of the corresponding row 302 and the usage-based-disturbance data 214 for the corresponding row 302. The usage-based-disturbance data 214 can include, for instance, the activation count 308 for the row 302.

In example operations, the UBD mitigation circuit 120-2 creates or maintains the usage-based-disturbance queue 802. In some cases, the UBD mitigation circuit 120-2 adds an entry 804 to the usage-based-disturbance queue 802 responsive to an activation count 308 meeting (e.g., equaling or exceeding) a mitigation threshold. For instance, each time a row 302 is accessed (e.g., activated), the UBD mitigation circuit 120 can increment the activation count 308 using an activation count update (ACU) unit (not shown) and compare the incremented activation count 308 to the mitigation threshold. If the incremented activation count 308 meets the mitigation threshold, then an entry 804 is created and added to the usage-based-disturbance queue 802, with the address 304 of the entry 804 corresponding to the accessed row 302. If there is a preexisting entry 804 for the accessed row 302, the activation count 308 of the usage-based-disturbance data 214 of the preexisting entry 804 can be updated.

The incremented activation count 308 is also returned to the row 302 in association with the normal data 306 of the row 302. Meanwhile, over time, the usage-based-disturbance queue 802 can be managed in any of multiple manners. First, the queue can be operated in a first-in, first-out (FIFO) manner in which an oldest entry 804 is addressed with a UBD mitigation operation 130 before newer entries. Alternatively, entries may be addressed with a UBD mitigation operation 130 based on the corresponding activation count 308, such as the highest activation count 308 being remediated first. Second, if the usage-based-disturbance queue 802 is full and another row 302 is newly identified for admission as a new entry 804, another entry (e.g., the oldest entry or the entry with the lowest activation count) can be replaced. Alternatively, the newly identified row 302 can be added to the usage-based-disturbance queue 802 conditional on its activation count 308 exceeding those counts that are already present in the queue. In other cases, the UBD mitigation circuit 120-2 can keep a list of entries 804 in the usage-based-disturbance queue 802 based on multiple mitigation thresholds, a recency indication, no mitigation threshold (e.g., the highest activation counts are maintained without regard to a threshold), or some combination thereof.

From time to time, including during the times that are described herein, the UBD mitigation circuit 120-2 is assigned an opportunity to perform, or is commanded to perform, a UBD mitigation operation 130. If there is no populated or pending entry 804, the UBD mitigation circuit 120-2 can pass or skip the mitigation opportunity. For the UBD mitigation operation 130, the UBD mitigation circuit 120-2 identifies an entry 804 from the usage-based-disturbance queue 802. The identified entry 804 can be selected based on a FIFO approach, based on which activation count is highest, based on a last-in, first-out (LIFO) approach, and so forth. To mitigate the usage-based-disturbance situation, the UBD mitigation circuit 120-2 refreshes one or more "victim" rows of the row 302 having the address 304 that is identified in the selected entry 804 and that is the aggressor row in this situation.

The one or more row-based memory-cell refresh operations (or charge restore operations) for the UBD mitigation operation 130 can be performed during one or more refresh-pump time intervals. Responsive to performing the one or more refresh operations, the activation count 308 of the aggressor row 302 can be reset (e.g., to zero). Further, the entry 804 can be removed from the usage-based-disturbance queue 802 physically (e.g., by erasing the data of the entry 804 or changing a pointer structure) or virtually/logically (e.g., by adjusting a flag indicating the validity of the entry 804, such as a valid flag bit). Although certain aspects for a UBD mitigation operation 130 have been described herein, these aspects are set forth by way of example only, for a UBD mitigation operation 130 may be performed in various alternative manners.

Figure 9:
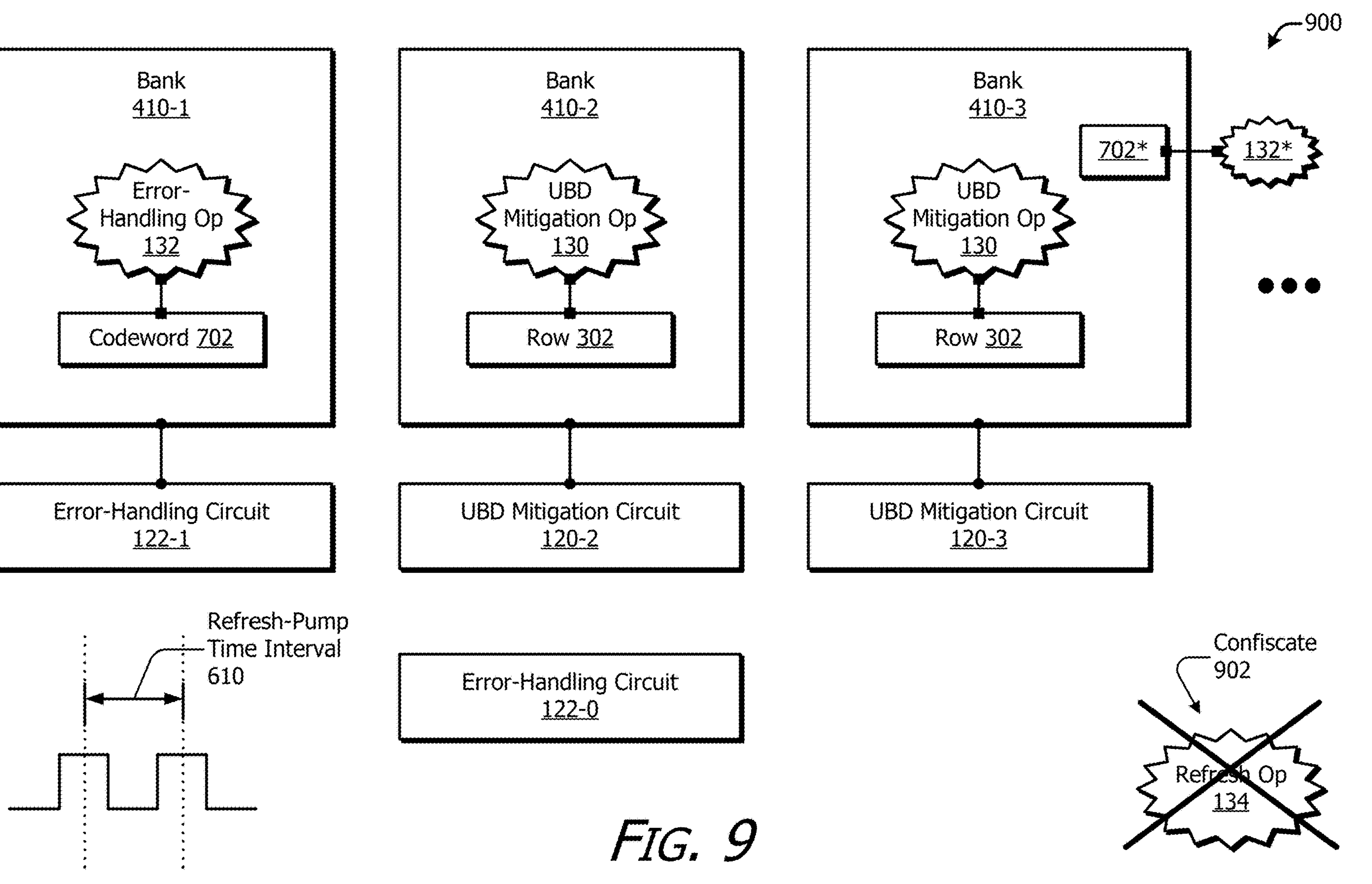
FIG. 9 illustrates example approaches for implementing aspects of efficient coordination of error handling and usage-based-disturbance mitigation across multiple banks of memory.

FIG. 9 illustrates example approaches 900 for implementing aspects of efficient coordination of data-error handling and usage-based-disturbance mitigation across multiple banks of memory, such as a first bank 410-1, a second bank 410-2, and a third bank 410-3. As shown, the first bank 410-1 includes at least one codeword 702 and corresponds to a first error-handling circuit 122-1. The second bank 410-2 includes at least one row 302 and corresponds to a second UBD mitigation circuit 120-2. The third bank 410-3 includes at least one row 302 and corresponds to a third UBD mitigation circuit 120-3. These circuits can perform at least one operation during at least one refresh-pump time interval 610.

In example implementations generally, a memory device 108 (e.g., of FIGS. 1, 2, and 4) has multiple banks 410-1 to 410-B including a first bank 410-1 and a second bank 410-2. The memory device 108 also includes at least one error-handling circuit 122 (e.g., the bank-specific error-handling circuit 122-1) and at least one usage-based-disturbance mitigation circuit 120 (e.g., the UBD mitigation circuit 120-2). The error-handling circuit 122-1 is coupled to the first bank 410-1 of the multiple banks 410-1 to 410-B. The error-handling circuit 122-1 is configured to perform, during a refresh-pump time interval 610, an error-handling operation 132 on a codeword 702 stored in the first bank 410-1. The usage-based-disturbance mitigation circuit 120-2 is coupled to the second bank 410-2 and is configured to perform, during the refresh-pump time interval 610, a usage-based-disturbance mitigation operation 130 on a row 302 in the second bank 410-2.

The refresh-pump time interval 610 corresponds to an opportunity to perform a refresh pump to restore a charge level of at least one row of the multiple banks 410-1 to 410-B. This opportunity can be, for example, an opportunity to perform at least one refresh operation 134 by a refresh circuit 124 (e.g., of FIGS. 1, 2, 4, 5-2, and 12). The refresh circuit 124 is coupled to at least one bank 410 of the multiple banks 410-1 to 410-B, as depicted in FIG. 5. The refresh circuit 124 is configured to ascertain the opportunity to perform the refresh pump responsive to at least one of a self-refresh command or an auto-refresh command. The refresh circuit 124 can, for instance, receive the self-refresh command or the auto-refresh command from a memory controller. The auto-refresh command may be realized by an all-bank refresh command (REFab) or a same-bank refresh command (REFsb).

In some cases, the error-handling operation 132 includes (e.g., is performed in accordance with) an error check and scrub (ECS) operation. Accordingly, the error-handling circuit 122-1 can detect a data error in the codeword 702 and log the data error for reporting external to the memory device 108. In example aspects, the codeword 702 includes multiple data bits 704 and multiple check bits 706. To perform the error-handling operation 132, the error-handling circuit 122-1 determines at least one bit error in the codeword 702 based on an operation that uses the multiple data bits 704 and the multiple check bits 706. The error-handling circuit 122-1 corrects the at least one bit error in the codeword 702 using the multiple data bits 704 and the multiple check bits 706.

In some implementations, a centralized or bank-shared error-handling circuit 122-0 can control error-handling operations across multiple banks. As shown in FIG. 9, the multiple banks 410-1 to 410-B can include a third bank 410-3. The error-handling circuit 122 can be realized with, for instance, at least a bank-shared error-handling circuit 122-0. The bank-shared error-handling circuit 122-0 can initiate, during a refresh-pump time interval 610, an error-handling operation 132 on the codeword 702 stored in the first bank 410-1. The bank-shared error-handling circuit 122-0 can also initiate, during another refresh-pump time interval 610, another error-handling operation 132* on another codeword 702 stored in the third bank 410.

As described herein, a coordination circuit 126 (e.g., of FIGS. 1, 2, 4, 5-2, 12, and 14 to 16) of control circuitry 208 (e.g., of FIGS. 2, 5-2, and 12) can confiscate 902 the refresh opportunity and share it with other circuits (besides the refresh circuit 124) to perform other functions in a time-efficient manner. The coordination circuit 126 can therefore assign the confiscated refresh opportunity to the error-handling circuit 122-1 and the UBD mitigation circuit 120-2. During this refresh opportunity, such as during at least one refresh-pump time interval 610, various operations of various types may be performed, including a same type of operation being performed multiple times during a same refresh-pump time interval 610.

For example, consider an approach of implementing multiple error-checking operations as part of the error-handling operation 132, or of implementing multiple error-handling operations, during a single refresh-pump time interval 610. The error-handling circuit 122-1 can perform, during the refresh-pump time interval 610, multiple error-handling operations 132 on multiple codewords (e.g., a first codeword 702-1 and a second codeword 702-2 of FIG. 7) that are stored in the first bank 410-1. Thus, the multiple error-handling operations may be performed on multiple codewords that are stored in the same bank by performing an error-handling operation on a codeword stored in the first bank and another error-handling operation on another codeword stored in the first bank.

This approach can enable the error-handling circuit 122 to advance through two codewords per all-bank refresh command (REFab). By doing so, a total quantity of all-bank refresh commands to be confiscated to check for errors across some set of codewords can be halved. Thus, the error-handling circuit 122 can repeatedly perform, during the refresh-pump time interval 610, multiple error-handling operations on different multiple codewords in response to each all-bank refresh command of multiple all bank refresh commands. This efficiency can be further improved by increasing the quantity of codewords checked per all-bank refresh command to three, four, or more.

As another example approach of implementing multiple operations per confiscated refresh-pump time interval 610, more than one bank 410 can be mitigated for usage-based-disturbance during a given refresh-pump time interval 610. For instance, as shown in FIG. 9, the multiple banks 410-1 to 410-B can include a third bank 410-3. Accordingly, to increase the efficient use of the limited resource of confiscated refresh pumps, the at least one usage-based-disturbance mitigation circuit 120 can perform a respective usage-based-disturbance mitigation operation on a respective row 302 in each bank 410 of two or more banks. In FIG. 9, the two or more banks can include the second bank 410-2 and the third bank 410-3. Thus, the second UBD mitigation circuit 120-2 can perform a UBD mitigation operation 130 on the row 302 of the second bank 410-2, and the third UBD mitigation circuit 120-3 can perform another UBD mitigation operation 130 on the row 302 of the third bank 410-3. Additional examples of performing multiple UBD mitigation operations during a given refresh-pump time interval 610 are described below with reference to FIGS. 10-1 and 10-2.

In some implementations, to perform a usage-based-disturbance mitigation operation 130, the usage-based-disturbance mitigation circuit 120-2 applies a charge restore operation to restore a charge level to one or more victim rows in the second bank 410-2, with the one or more victim rows including the row 302 in the second bank 410-2. In example aspects, the at least one usage-based-disturbance mitigation circuit 120-2 can further determine an aggressor row in the second bank 410-2 using at least one queue (e.g., a usage-based-disturbance queue 802 of FIG. 8) that stores one or more entries, with each entry 804 including an address 304 (e.g., at least a row address) corresponding to an activation count 308 of the aggressor row. Here, the aggressor row is proximate to (e.g., adjacent to or otherwise near) the one or more victim rows in the second bank 410-2.

FIGS. 10-1 and 10-2 illustrate example schemes 1000-1 and 1000-2 for performing at least one error-handling operation 132 (e.g., of FIG. 7) and one or more usage-based-disturbance mitigation operations 130 (e.g., of FIG. 8) across at least two banks of multiple banks 410-1 to 410-B of memory. By way of example only, consider a memory array having 32 banks of memory. The 32 banks (BA) of memory are organized into eight bank groups (BG), so each bank group has four banks. For clarity, the 32 banks are arranged into a four-by-eight (4×8) grid. Along the top row of the grid, bank groups 1 to 8 are indicated. Along the first column of the grid, banks 1 to 4 are indicated. Thus, each column represents one of eight bank groups, and each bank group includes four banks having identifiers 1, 2, 3, and 4.

To illustrate the example first scheme 1000-1 and second scheme 1000-2, consider a scenario in which the second bank (BA 2) of the fourth bank group (BG 4) is assigned a refresh opportunity (e.g., a refresh-pump time interval 610) to perform an error-handling operation 132. This is indicated with "EH" text and a cross-hatched fill pattern. A bank that is assigned the same refresh opportunity, but for a UBD mitigation operation 130, is indicated with "UBD Mitigation" text and a dotted fill pattern. Further, banks that are not assigned an operation (e.g., at least neither an error-handling operation 132 nor a UBD mitigation operation 130) during that refresh opportunity are marked as being idle with "Idle" text and no fill pattern.

Generally, if at least one UBD mitigation circuit 120 is assigned to perform at least one UBD mitigation operation 130, each respective UBD mitigation circuit 120-*x* can perform a respective usage-based-disturbance mitigation operation 130-*x* on a row 302 in each respective bank 410-*x* of two or more banks. As shown in FIG. 9 by way of example, the two or more banks may include a second bank 410-2 and a third bank 410-3 of multiple banks.

In FIG. 10-1, the example first scheme 1000-1 can correspond to an all-bank refresh (REFab) command. For some aspects in this context, all the banks correspond to the multiple banks that are included on an integrated circuit chip of a memory device. Here, the two or more banks, on which a respective UBD mitigation operation 130-*x* is performed, include all banks of the integrated circuit chip except for the first bank in which an error-handling operation 132 is being performed. This situation is depicted in FIG. 10-1.

In the first scheme 1000-1, the second bank (BA 2) of the fourth bank group (BG 4) is assigned an error-handling operation 132. The other 31 banks are assigned a UBD mitigation operation 130. Thus, an error-handling circuit 122 corresponding to the second bank of the fourth bank group performs an error-handling operation 132. The one or more UBD mitigation circuits 120 corresponding to the other 31 banks each perform at least one UBD mitigation operation 130. At times, however, a UBD mitigation operation 130 may entail determining that no row has a sufficiently high-valued activation count 308 and thus that no charge restore operation is to be performed during a given opportunity or time interval for that bank. For example, the likelihood that an activation count 308 will continue to increase and become indicative of a usage-based-disturbance problem can be outweighed by the likelihood that a normal refresh operation will be performed first.

In FIG. 10-2, the example second scheme 1000-2 can correspond to a same-bank refresh (REFsb) command. With a same-bank refresh command, the memory controller may be reserving the ability to perform read or write input/output operations on the banks that are not the same bank. In some cases, banks can be identified by one or more bits in an address that are associated with the bank. Thus, the same banks can have the same bank-address bit values. Other banks have different bank-address bit values.

In some aspects, multiple banks can include or be organized into multiple bank groups. Each respective bank (BA)

in a bank group (BG) of the multiple bank groups corresponds to a respective categorization of multiple categorizations. A first bank of the multiple banks, which is experiencing the error-handling operation 132, may correspond to a first categorization of the multiple categorizations. Two or more banks, which experience at least one UBD mitigation operation 130, can include up to all other banks across the multiple bank groups for those banks corresponding to the first categorization of the multiple categorizations. Banks across the multiple bank groups that do not correspond to the first categorization are reserved by the memory controller for the ability to perform read or write input/output operations.

Example categorizations include bank address bits, a bank number or other identifier, a position on an IC chip (e.g., relative to banks in other bank groups), and so forth. Generally, the first categorization of the multiple categorizations can therefore include one or more bits corresponding to a bank address. With reference to the second scheme 1000-2, banks numbered 1, 3, and 4 correspond to other banks that have a different categorization as compared to the bank number 2 of the second bank of the fourth bank group. Thus, banks 2 across the multiple bank groups 1 to 3 and 5 to 8 are assigned to perform a UBD mitigation operation 130, but the banks with the bank numbers 1, 3, and 4 are not. As shown, the bank 2 of the fourth bank group is assigned the error-handling operation 132, and the other banks having the bank number 2 identifier or categorization are assigned to perform UBD mitigation. Banks 1, 3, and 4 in other (up to all other) bank groups are idled indicating their availability to perform read or write input/output operations as per commands that may be received from a memory controller. Example processes for implementing aspects of efficient coordination of data-error handling and usage-based-disturbance mitigation (e.g., in which such operations may be performed during a same time interval) are described below with reference to FIG. 11 in the subsection entitled "Example Methods," which is after the description of FIG. 16.

Figure 12:
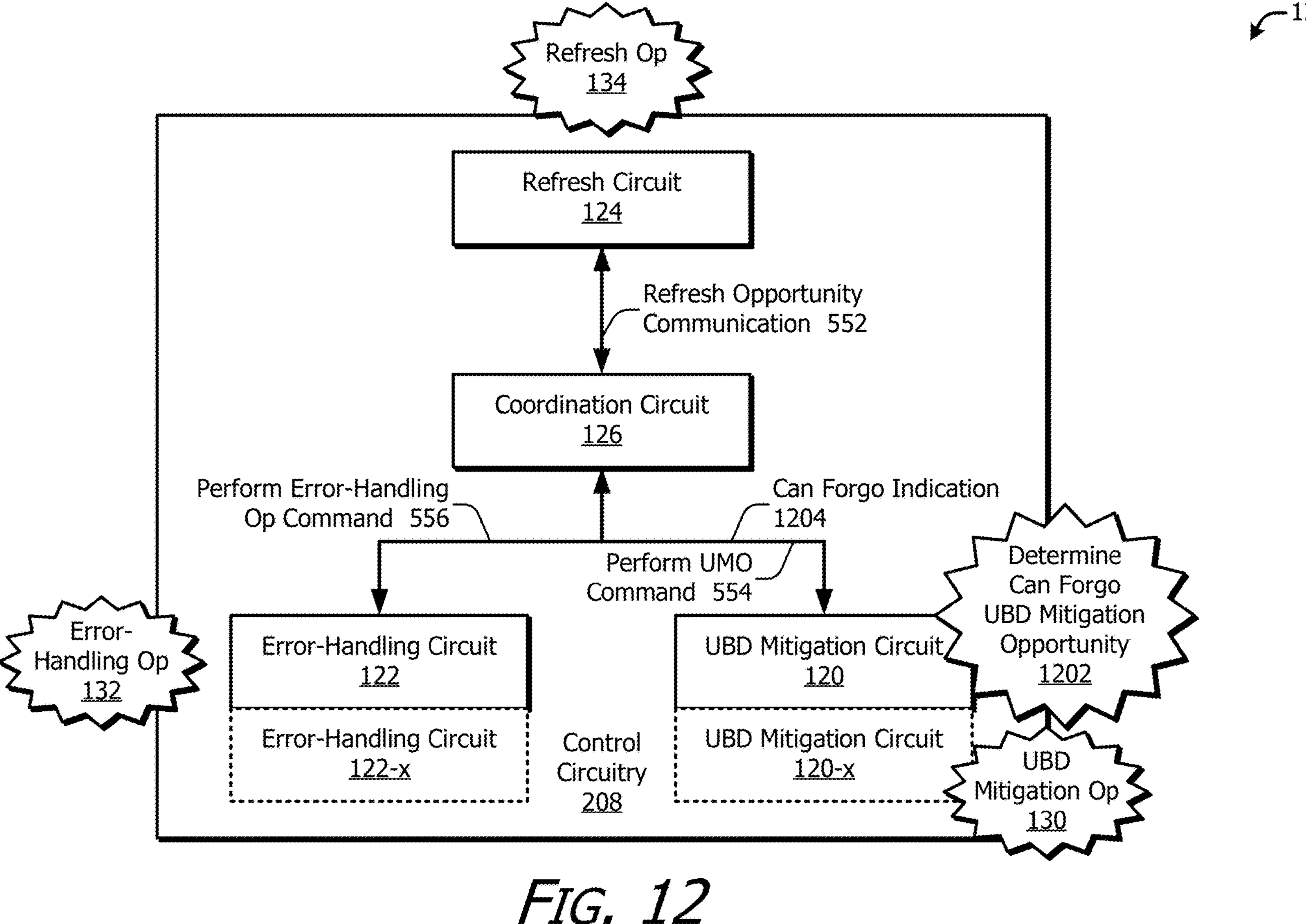
FIG. 12 illustrates an example communication scheme between two or more circuits for communicating if a bank can forgo a usage-based-disturbance mitigation opportunity in favor of error handling to support efficient coordination of error handling and usage-based-disturbance mitigation.

FIG. 12 illustrates an example communication scheme 1200 between two or more circuits for communicating if a bank can forgo a usage-based-disturbance mitigation opportunity in favor of error handling to support efficient coordination of error handling and usage-based-disturbance mitigation. The communication scheme 1200 of FIG. 12 can at least partially overlap with the communication scheme 500-2 of FIG. 5-2. The communication scheme 1200, however, has additional or alternative aspects. By way of example only, the error-handling circuit 122 can include or be realized with a bank-specific instance as the error-handling circuit 122-*x* (e.g., as the error-handling circuit 122-1, which can correspond to bank 410-1, of FIG. 14). Similarly, the UBD mitigation circuit 120 can include or be realized with a bank-specific instance as the UBD mitigation circuit 120-*x* (e.g., as the UBD mitigation circuit 120-1 of FIG. 14).

In example implementations, the coordination circuit 126 can receive a refresh opportunity communication 552 from the refresh circuit 124, which communication is also described herein with reference to FIG. 5-2. The coordination circuit 126 can choose to confiscate 902 (e.g., of FIG. 9) a time period of a refresh operation 134. Responsive to a confiscation 902, the coordination circuit 126 determines how to allocate or assign the time period, such as for at least one error-handling operation 132 or one or more UBD mitigation operations 130. The coordination circuit 126 can select a bank 410 for performing an error-handling operation 132 and issue an associated perform error-handling operation command 556. This command can be provided to a bank-shared error-handling circuit 122-0 or a bank-specific error-handling circuit 122-*x*, including both in some cases. Based on this bank selection for the error-handling operation 132, the coordination circuit 126 can also select one or more banks for performing at least one UBD mitigation operation 130. The coordination circuit 126 can further issue associated instances of the perform UBD mitigation operation (UMO) command 554 (perform UMO command 554). This command can be provided to a bank-shared UBD mitigation circuit 120-0 or a bank-specific UBD mitigation circuit 120-*x*, including both in some cases.

As described herein (e.g., with reference to FIGS. 9-11), these operations can be performed at least partially in an overlapping manner or during a same refresh time interval, such as a same refresh-pump time interval 610. This enables a potentially problematic usage-based-disturbance situation to be addressed while also progressing toward checking each row of a memory device for errors within a prescribed duration (e.g., every 12, 24, or 48 hours). If the bank to be commanded to perform an error-handling operation 132 is selected first, however, this can effectively prioritize the error-handling functionality over the UBD mitigation functionality. In contrast with this relative prioritization, performing a UBD mitigation operation may be more time-pressing than performing an error-handling operation. Although each memory location of a memory device is typically expected to undergo at least one error-handling operation over some duration that extends into several hours, a usage-based-disturbance attack may unfold over seconds, or even fractions of a second.

Accordingly, some implementations that are described herein enable communications as to whether a bank 410 can forgo a UBD mitigation opportunity. Such a determination can be based, for instance, on a risk assessment involving one or more factors as described herein. If the bank 410 can forgo the UBD mitigation opportunity, the coordination circuit 126 can issue a perform error-handling operation command 556 to the bank 410. If forgoing the UBD mitigation opportunity is inadvisable, on the other hand, the coordination circuit 126 can issue a perform UBD mitigation operation command 554 to the bank 410, or the coordination circuit 126 can merely refrain from issuing the perform error-handling operation command 556 to the bank 410 during a time period that is available to the bank 410 for performing a UBD mitigation operation 130.

In example operations, the UBD mitigation circuit 120 can determine if a bank 410 can forgo a UBD mitigation opportunity at 1202. A bank-specific UBD mitigation circuit 120-*x*, for instance, can determine 1202 if a corresponding bank 410-*x* (not shown in FIG. 12) can forgo performing a UBD mitigation operation 130. Generally, this determination can be based at least partially on at least one activation count 308 for at least one row 302 in the corresponding bank 410-*x*. Examples for the determination 1202 are described below with reference to FIG. 14. The UBD mitigation circuit 120 can provide (e.g., transmit) to the coordination circuit 126 an indication 1204 that the corresponding bank 410 can forgo a UBD mitigation opportunity. Example bus architectures and protocols for communicating the indication 1204 are described below with reference to FIGS. 15-17. Next, however, an example scenario in which a bank 410 can forgo a UBD mitigation opportunity (e.g., in favor of an error-handling operation 132) is described with reference to FIG. 13.

Figure 13:
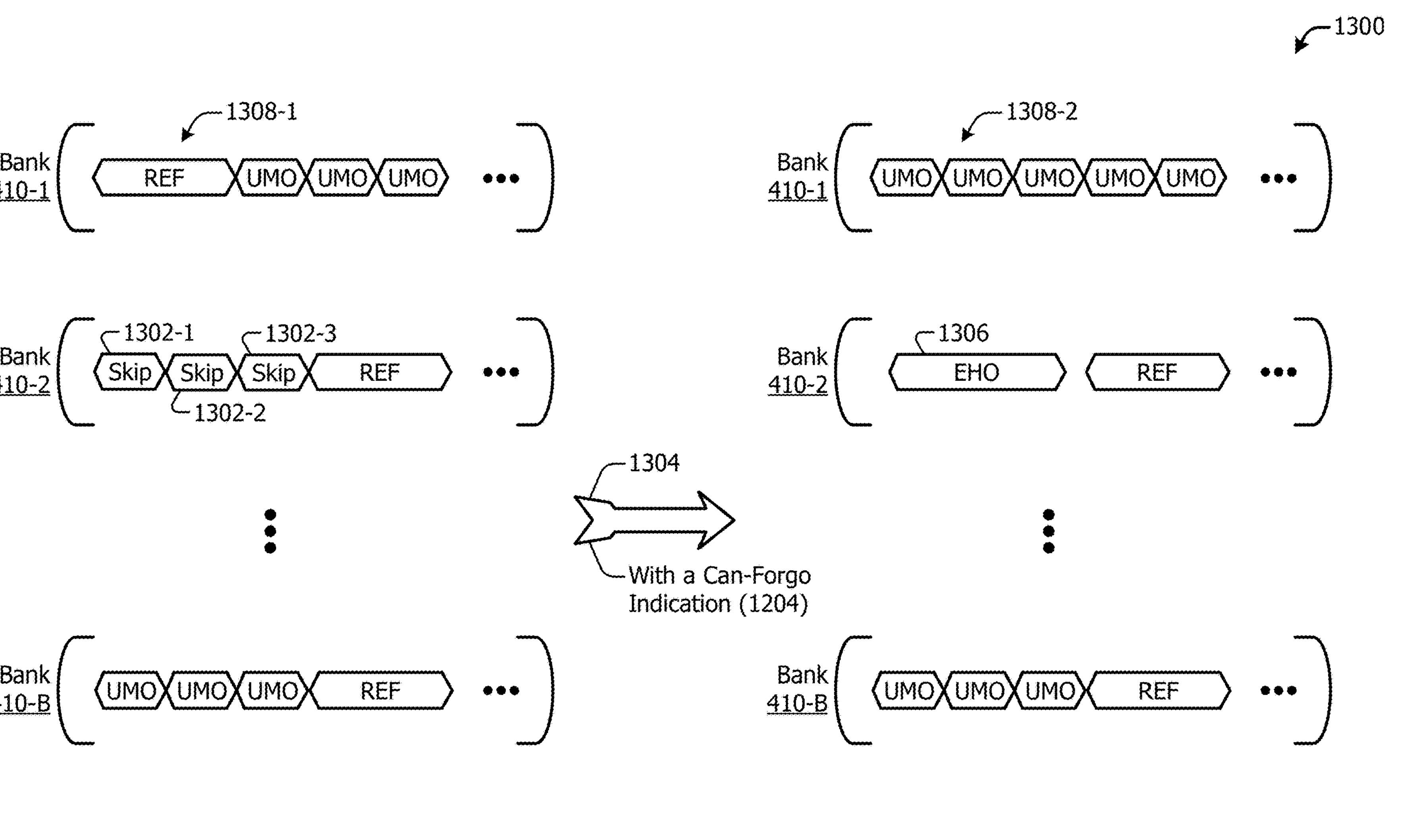
FIG. 13 depicts a series of example time periods in which banks can perform various operations, including an error-handling operation in lieu of skipping a usage-based-disturbance mitigation opportunity.

FIG. 13 depicts, generally at 1300, a series of example time periods in which banks 410-1 to 410-B (e.g., of FIGS. 4 and 5-1) can perform various operations, including an error-handling operation (EHO) in lieu of skipping a usage-based-disturbance mitigation opportunity. Depicted on the left, there are example statuses of multiple banks 410-1, 410-2, . . . , 410-B across multiple time periods. These statuses can correspond, for example, to a refresh operation 134 ("REF"), a UBD mitigation operation 130 ("UMO"), or a skipping of a UBD mitigation opportunity ("Skip"). As shown, the second bank 410-2 is skipping three opportunities to perform a UBD mitigation operation (UMO) as indicated at skip statuses 1302-1, 1302-2, and 1302-3.

Figure 14:
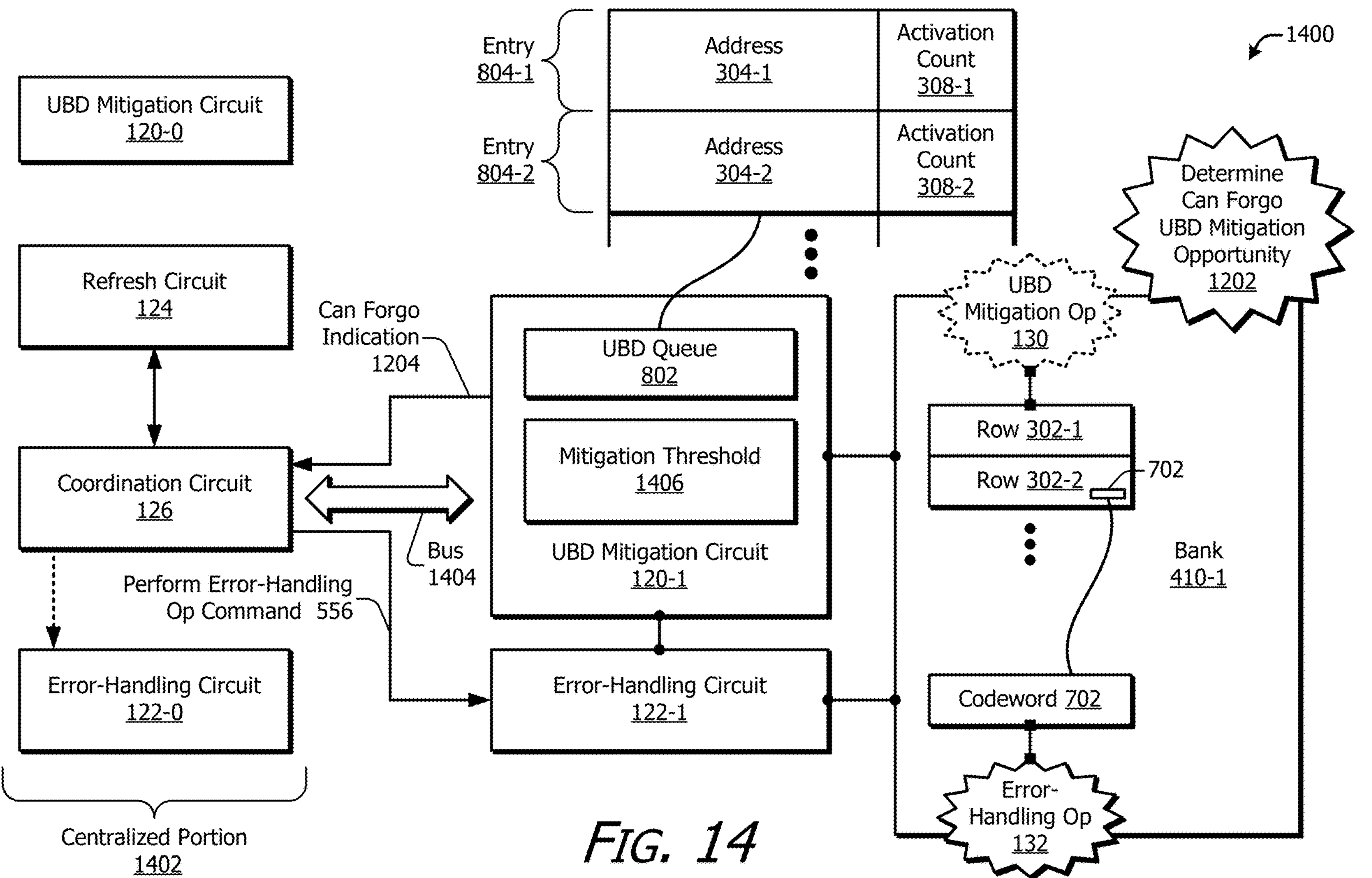
FIG. 14 illustrates example aspects of communicating if a bank can forgo a usage-based-disturbance mitigation opportunity in favor of error handling to support efficient coordination of error handling and usage-based-disturbance mitigation.

These skipping statuses 1302-1 to 1302-3 can correspond to time periods when the second bank 410-2 can forgo performing a UBD mitigation operation 130, which situation is described further with reference to FIG. 14. Without knowledge of the skipping statuses 1302-1 to 1302-3, the control circuitry 208 (e.g., of FIGS. 2, 5-1, and 12) could command the $B^{th}$ bank 410-B to perform an error-handling operation 132 when the $B^{th}$ bank 410-B has one or more UBD mitigation operations (UMOs) queued up or otherwise has at least one victim row that is primed to be mitigated. This is inefficient because the second bank 410-2 can perform an error-handling operation 132 during these skip periods without appreciably increasing the risks of usage-based-disturbance situations at the second bank 410-2 as compared to the $B^{th}$ bank 410-B and without squandering a UBD mitigation opportunity that is usable by (e.g., more important to) the $B^{th}$ bank 410-B.

This document describes strategies and techniques to increase operational efficiency or lower the risks of usage-based-disturbance activities (including strategies and techniques for achieving both) by determining one or more banks that can forgo at least one usage-based-disturbance mitigation opportunity. In example implementations, the second bank 410-2 can provide an indication 1204 (e.g., also of FIG. 12) that the second bank 410-2 can forgo at least one usage-based-disturbance mitigation operation 130. In some cases, a second UBD mitigation circuit 120-2 (not shown in FIG. 13), which corresponds to the second bank 410-2, can provide the indication 1204 to a coordination circuit 126 that is positioned in a centralized portion of an integrated circuit of a memory device.

Depicted on the right, as represented by arrow 1304, there are example statuses of multiple banks 410-1, 410-2, . . . , 410-B across multiple time periods in which the second bank 410-2 has communicated (e.g., by providing an indication 1204) that the bank can forgo a UBD mitigation opportunity. These statuses include an error-handling operation ("EHO"). Thus, the second bank 410-2 can perform an error-handling operation 132 for the time period corresponding to the EHO status 1306 in lieu of skipping a UBD mitigation opportunity or performing a less-pressing UBD mitigation operation 130. In some cases, the coordination circuit 126, or another portion of the control circuitry 208, can send a perform error-handling operation command 556 to the second bank 410-2. This enables the circuitry to efficiently occupy or utilize the skipped time period(s) by performing an error-handling operation 132 or to perform an error-handling operation 132 instead of performing a less important (e.g., non-critical) UBD mitigation operation 130.

By way of example only, the statuses for the first bank 410-1 are also changed between the scenario on the left and the one on the right of FIG. 13. In some implementations, a row address (or row counter) may be tracked for purposes of performing refresh operations across multiple banks (e.g., up to all banks) on an integrated circuit or other unit of a memory device. In other words, a row counter may be shared across multiple banks. In at least some of such implementations, the row counter is not advanced until all the associated banks are refreshed at a given row address. Consequently, it may provide less benefit to refresh a single bank, or even fewer than all the associated banks, during a given refresh opportunity as compared to using the time interval for another operation type. Accordingly, if a refresh opportunity is being confiscated for an error-handling operation 132 in one bank 410, the other banks can focus on performing UBD mitigation operations (UMOs) instead of engaging in a piecemeal approach to refreshing the banks that cannot individually advance the row counter. An example of this "substitution" of operations is shown by the statuses at 1308-1 on the left as compared the statuses 1308-2 on the right. This substitution may be less efficient, however, if per-bank row counters are employed for refresh operations.

FIG. 14 illustrates, generally at architecture 1400, example aspects of communicating if a bank can forgo a usage-based-disturbance mitigation opportunity in favor of error handling to support efficient coordination of error handling and usage-based-disturbance mitigation. As shown, the example architecture 1400 includes at least one refresh circuit 124, at least one coordination circuit 126, and at least one first bank 410-1. Corresponding to the first bank 410-1, the architecture 1400 can also include a first UBD mitigation circuit 120-1 and a first error-handling circuit 122-1. The first UBD mitigation circuit 120-1 and the first error-handling circuit 122-1 can be realized as bank-specific instances of, or portions of, a UBD mitigation circuit 120 (e.g., a bank-specific UBD mitigation circuit 120-*x*) and an error-handling circuit 122 (e.g., a bank-specific error-handling circuit 122-*x*), respectively.

In example implementations, the architecture 1400 can include at least one centralized portion 1402, or bank-shared portion 1402, of an integrated circuit (IC) chip. The centralized portion 1402 can be positioned, for instance, between at least two banks, and up to all banks, of a given IC chip. FIG. 5-1 depicts an example of a centralized portion in relation to bank-shared circuitry 504. The centralized portion 1402 can also include a bank-shared instance of, or a portion of, the UBD mitigation circuit 120 or the error-handling circuit 122. These are respectively depicted in FIG. 14 as the bank-shared UBD mitigation circuit 120-0 and the bank-shared error-handling circuit 122-0.

As shown, the first bank 410-1 includes multiple rows, such as a first row 302-1 and a second row 302-2. Each row 302 also includes at least one codeword 702. Generally, the first UBD mitigation circuit 120-1 can perform a UBD mitigation operation 130 on a row 302. Some example aspects of a UBD mitigation operation 130 are described herein with reference to FIG. 8. Further, the first error-handling circuit 122-1 can perform an error-handling operation 132 on a codeword 702. Some example aspects of an error-handling operation 132 are described herein with reference to FIG. 7. At least one bank-specific circuit, such as the first UBD mitigation circuit 120-1 or the error-handling circuit 122-1, can be coupled to one or more circuits of the centralized portion 1402, such as the coordination circuit 126 via at least one bus 1404. The bus 1404 can be implemented in different manners. Two example approaches for implementing the bus 1404 are described below with reference to FIGS. 15-17.

In some example aspects, the first UBD mitigation circuit 120-1 includes at least one usage-based-disturbance queue 802. The first UBD mitigation circuit 120-1 can determine 1202 if the first bank 410-1 can forgo a UBD mitigation opportunity using at least one mitigation threshold 1406. The usage-based-disturbance queue 802 can include one or more entries, such as a first entry 804-1 and a second entry 804-2. Each respective entry 804 includes a respective address 304 and a respective activation count 308. For example, the first entry 804-1 can include a first address 304-1 and a first activation count 308-1. The second entry 804-2 can include a second address 304-2 and a second activation count 308-2. An entry 804 may, however, include more, fewer, or different fields or contents thereof.

A usage-based-disturbance queue 802 can include any quantity of entries, such as 1, 2, 4, 8, 10, 16, and so forth. Some of the description herein, including regarding the first bank 410-1 and in the context of the architecture 1400, focuses on a particular bank and the bank-specific circuitry corresponding thereto. Nonetheless, the described principles and techniques are applicable to one or more other banks. Further, the principles and techniques may be applicable to sets of banks, such as pairs of banks.

In example operations, the first UBD mitigation circuit 120-1 determines 1202 if the first bank 410-1 can forgo a UBD mitigation opportunity. The determination 1202 can be made, for example, responsive to the expiration of an interval, responsive to the occurrence of an event, responsive to a signal (e.g., internal or external signal), responsive to a clock, continuously or asynchronously, some combination thereof, and so forth. For instance, the first UBD mitigation circuit 120-1 can make the determination 1202 responsive to the closing of a row 302, after each defined period of time, responsive to a change to the contents of the usage-based-disturbance queue 802, or responsive to a command from another circuit, such as a command from the centralized portion 1402. The command may be an explicit command to make the determination 1202, a perform error-handling operation command 556, and so forth. Based on the determination 1202, the first UBD mitigation circuit 120-1 can provide (e.g., transmit) via the bus 1404 an indication 1204 of if the first bank 410-1 can forgo a UBD mitigation opportunity (e.g., a confiscated refresh time interval that is allocated for a UBD mitigation operation 130 or an error-handling operation 132).

The first UBD mitigation circuit 120-1 can make the determination 1202 based on any of one or more factors. Example factors can include one or more activation counts 308, at least one mitigation threshold 1406, a size of the usage-based-disturbance queue 802, a current population of (e.g., a quantity of valid entries in) the usage-based-disturbance queue 802, a quantity of activation counts 308 that exceed a given mitigation threshold 1406, some combination thereof, and so forth. Generally, the first UBD mitigation circuit 120-1 can make the determination 1202 to forgo the UBD mitigation opportunity if current risks to usage-based-disturbance effects are sufficiently low that mitigation can be delayed. These risks may be stochastically managed with a fixed or variable mitigation threshold 1406, for example.

In some implementations, the first UBD mitigation circuit 120-1 compares each respective activation count 308 of each respective row 304 to the mitigation threshold 1406. This comparison may be performed in accordance with any timing, such as regularly, in response to a refresh command, in response to a command to make the determination 1202, based on an activation count 308 being changed (e.g., incremented or cleared), some combination thereof, and so forth. If an activation count 308 meets the mitigation threshold 1406, the first UBD mitigation circuit 120-1 adds the address 304 corresponding to that activation count 308 to an entry 804 of the usage-based-disturbance queue 802. Once a risky usage-based-disturbance situation has been mitigated with respect to a given address 304, the entry 804 for that address can be removed (e.g., deleted, erased, cleared, overwritten, or marked as invalid).

In example aspects, the first UBD mitigation circuit 120-1 can indicate 1204 that the first bank 410-1 can forgo a UBD mitigation opportunity if the usage-based-disturbance queue 802 is empty. The usage-based-disturbance queue 802 may be empty if, for instance, the queue stores no valid entries (e.g., if no entry 804 has an associated valid flag). However, a UBD mitigation circuit 120 can make the determination in additional or alternative manners. In some cases, the UBD mitigation circuit 120 can determine 1202 to forgo a UBD mitigation opportunity if the usage-based-disturbance queue 802 holds no more than a specified quantity of entries (e.g., no more than zero, one, two, five, or ten entries). In other cases, the UBD mitigation circuit 120 can determine 1202 to forgo an opportunity if a certain number of UBD mitigation opportunities in a row have been taken or if a certain amount of time has elapsed since the circuit forwent a UBD mitigation opportunity.

The UBD mitigation circuit 120 can also employ multiple mitigation thresholds 1406. For example, if an activation count 308 of a row 302 meets a first mitigation threshold 1406, the UBD mitigation circuit 120 can cause an address 304 of the row 302 to be added as an entry 804 in the usage-based-disturbance queue 802. Nonetheless, the UBD mitigation circuit 120 can continue to forgo UBD mitigation opportunities until an activation count 308 of that row or another row meets a higher, second mitigation threshold 1406. The UBD mitigation circuit 120 may also combine factors. For instance, the UBD mitigation circuit 120 may determine 1202 to forgo UBD mitigation opportunities until multiple activation counts 308 meet the higher, second mitigation threshold 1406, even if the usage-based-disturbance queue 802 is already populated with multiple entries.

Figure 15:
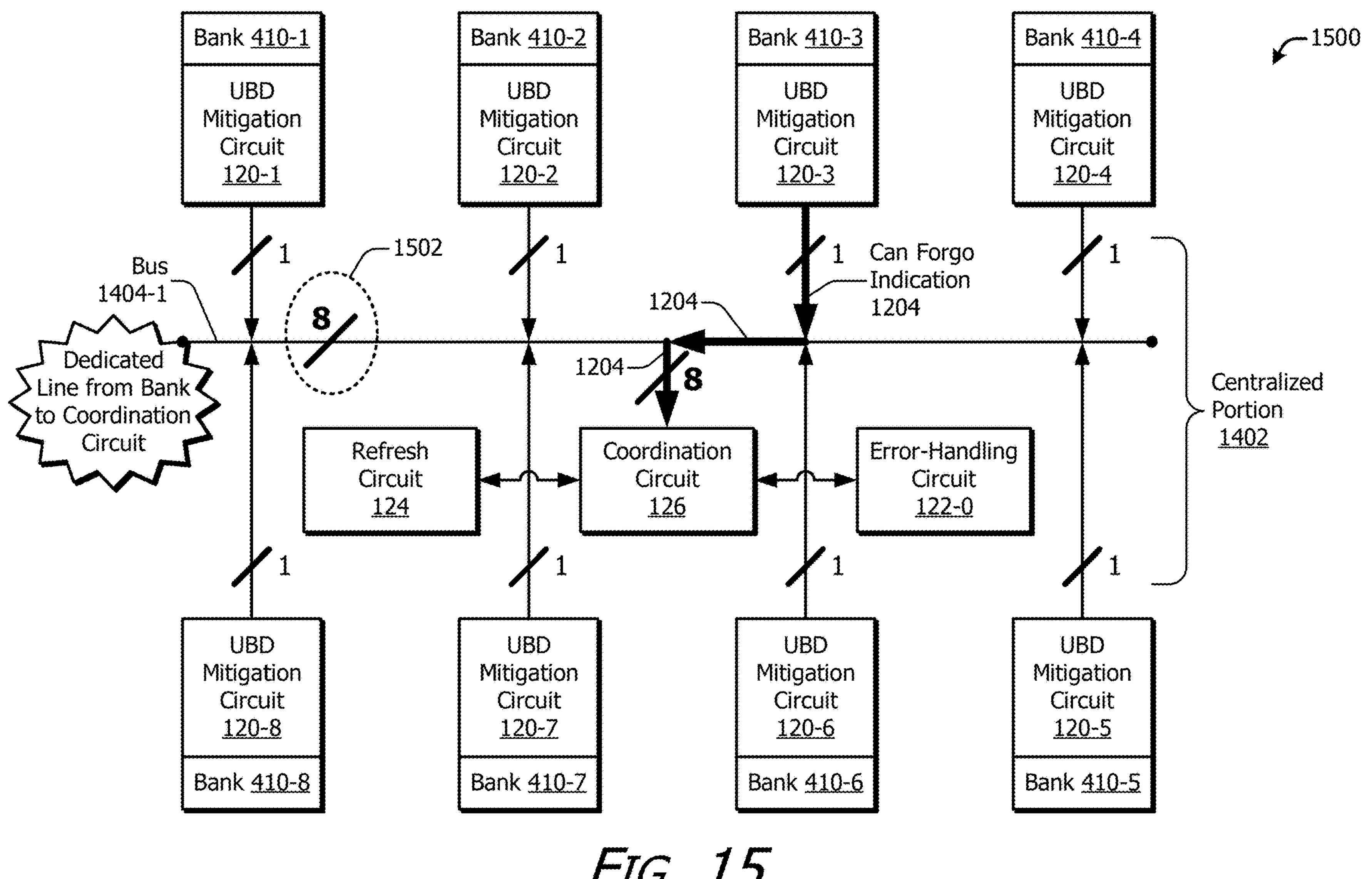
FIG. 15 illustrates example aspects of a first bus for communicating if a bank can forgo a usage-based-disturbance mitigation opportunity in favor of error handling to support efficient coordination of error handling and usage-based-disturbance mitigation.

FIG. 15 illustrates, generally at an architecture 1500, example aspects of a first bus 1404-1 for communicating if a bank 410 can forgo a usage-based-disturbance mitigation opportunity in favor of error handling to support efficient coordination of error handling and usage-based-disturbance mitigation. As shown, a centralized portion 1402 includes at least a refresh circuit 124, a coordination circuit 126, and a bank-shared error-handling circuit 122-0. The centralized portion 1402 also includes at least a shared portion of the bus 1404-1. The bus 1404-1 can propagate an indication 1204 if a bank can forgo a UBD mitigation opportunity. By way of example, the third bank 410-3, including a circuit corresponding thereto (e.g., the third UBD mitigation circuit 120-3), is depicted transmitting an indication 1204 from the third bank 410-3 to the coordination circuit 126.

In example implementations, multiple banks 410-1 to 410-8 surround at least part of the centralized portion 1402. Each respective bank 410-*x* of the multiple banks 410-1 to 410-8 corresponds to, or is associated with, a respective UBD mitigation circuit 120-*x* of multiple UBD mitigation circuits 120-1 to 120-8. For example, the first bank 410-1 corresponds to the first UBD mitigation circuit 120-1, and the second bank 410-2 corresponds to the second UBD mitigation circuit 120-2. As another example, the fourth bank 410-4 corresponds to the fourth UBD mitigation circuit 120-4, and the seventh bank 410-7 corresponds to the seventh UBD mitigation circuit 120-7.

Although each bank-specific UBD mitigation circuit 120-*x* can respectively correspond to, or be associated with, a bank 410-*x*, each bank-specific UBD mitigation circuit 120-*x* may be positioned or disposed proximate to (e.g., adjacent to) the centralized portion 1402. Alternatively, each bank-specific UBD mitigation circuit 120-*x* may be part of the centralized portion 1402. In either case, a bank-specific UBD mitigation circuit 120-*x* (or other bank-specific circuitry 502 that is described herein) may be positioned between a corresponding bank 410-*x* and bank-shared circuitry 504 (e.g., of FIG. 5), which can be disposed in the centralized portion 1402.

Eight banks 410-1 to 410-8 and eight UBD mitigation circuits 120-1 to 120-8 are shown in FIG. 15 (and FIG. 16) and are described herein. The quantity of either banks or circuits or both, however, can be more or less than eight. For example, an architecture can include 4, 12, 16, 32, 64, or more banks or UBD mitigation circuits. Additionally or alternatively, an architecture can include a different quantity of banks as compared to UBD mitigation circuits. For instance, if each pair of banks shares one UBD mitigation circuit, an architecture may have 32 banks and 16 UBD mitigation circuits.

In example implementations, the bus 1404-1 includes at least as many lines (e.g., wires) as the quantity of banks or UBD mitigation circuits, at least along the part of the bus 1404-1 that is disposed in the bank-shared or centralized portion 1402 of the architecture. This enables the bus 1404-1 to include a dedicated line or a respective line from the bank 410-*x* (or the UBD mitigation circuit 120-*x* corresponding thereto) to the coordination circuit 126 in the centralized portion 1402 for each respective bank 410 or UBD mitigation circuit 120.

In some cases, the bus 1404-1 has the same quantity of lines as there are banks or UBD mitigation circuits. In the example of FIG. 15, the bus 1404-1 includes eight (8) lines in the centralized portion 1402 as indicated at 1502 with "/8," and the quantity of banks is also eight (8). As illustrated with "/1," an individual line may extend between, or couple together, a given bank 410 or UBD mitigation circuit 120 and the multi-bank portion of the bus 1404-1.

Including multiple lines for the bus 1404-1, including one line respectively per bank to provide a dedicated line per bank, can simplify signaling. In FIG. 15, the third bank 410-3, including the third UBD mitigation circuit 120-3 that corresponds thereto, provides the indication 1204 to the coordination circuit 126 via the bus 1404-1. The bank 410-3 can drive a signal providing an affirmative or negative indication 1204. With a dedicated line of the bus 1404-1 for each bank 410, each bank 410 and provide the indication 1204 to the coordination circuit 126 without regard to if or when other banks may also be signaling an indication 1204.

The lines for buses, however, consume an appreciable space (e.g., area on a layer) of an IC chip. This space increases the cost of the IC chip. To reduce the space utilization by the bus 1404 (e.g., of FIG. 14), the quantity of lines can be reduced to be less than one per bank. An example architecture for such a bus is described next with reference to FIG. 16, and an example protocol for the bus of FIG. 16 is described thereafter with reference to FIG. 17.

Figure 16:
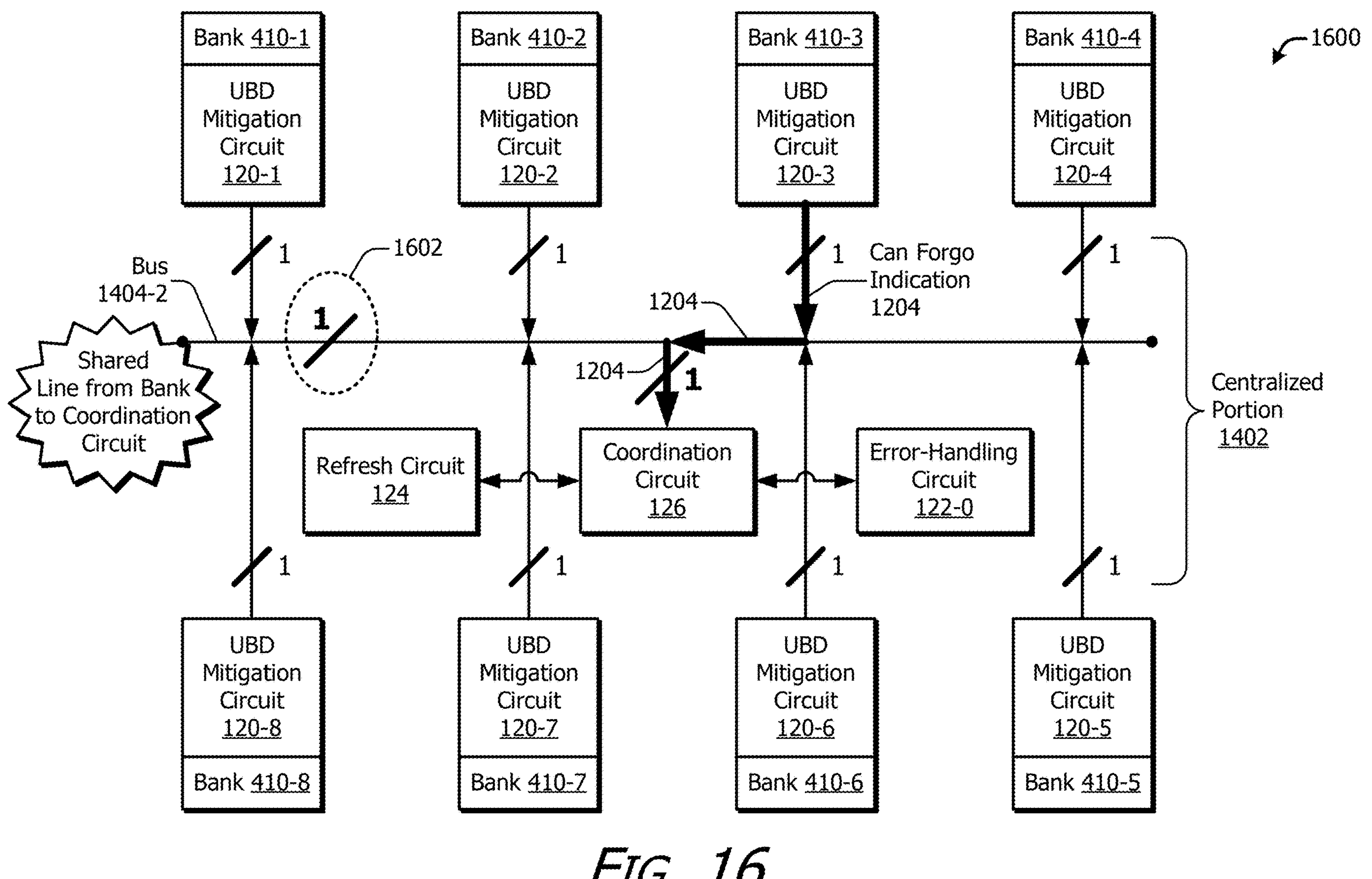
FIG. 16 illustrates example aspects of a second bus for communicating if a bank can forgo a usage-based-disturbance mitigation opportunity in favor of error handling to support efficient coordination of error handling and usage-based-disturbance mitigation.

FIG. 16 illustrates, generally at an architecture 1600, example aspects of a second bus 1404-2 for communicating if a bank 410 can forgo a usage-based-disturbance mitigation opportunity in favor of error handling to support efficient coordination of error handling and usage-based-disturbance mitigation. The example architecture of FIG. 16 is similar to the example architecture of FIG. 15. However, the bus 1404-2 in FIG. 16 can have one or more shared lines, including as few as a single line that is shared across all the banks associated with the centralized portion 1402. As shown, the centralized portion 1402 includes at least the shared portion of the bus 1404-2. The bus 1404-2 can propagate an indication 1204 if a bank can forgo a UBD mitigation opportunity. By way of example, the third bank 410-3, including a circuit corresponding thereto (e.g., the third UBD mitigation circuit 120-3), is depicted transmitting an indication 1204 from the third bank 410-3 to the coordination circuit 126.

In example implementations, the bus 1404-2 has fewer lines (e.g., wires) as compared to the quantity of banks or UBD mitigation circuits, including in the bank-shared or centralized portion 1402 of the architecture 1600. This enables the bus 1404-2 to be realized on an IC chip while consuming less space of the IC chip as compared to the bus 1404-1 of FIG. 15. In some cases, the bus 1404-2 has a single line, regardless of the quantity of banks or UBD mitigation circuits. Accordingly, in the example of FIG. 16, the bus 1404-2 includes one (1) line in the centralized portion 1402 as indicated at 1602 with "/1," even though the quantity of banks is eight (8). As illustrated with "/1," an individual line may extend between, or couple together, a given bank 410 or corresponding UBD mitigation circuit 120 and the bank-shared portion of the bus 1404-2.

The quantity of banks 410 can be more or less than 8, such as 4, 16, 24, 32, 64 or more banks 410. Generally, the bus 1404-2 can have a first quantity of one or more lines, and two or more banks that are configured to share the bus 1404-2 have a second quantity of banks. Here, the first quantity is lower than the second quantity. In some cases, the first quantity of lines of the bus 1404-2 may be equal to one line, regardless of the quantity of banks that share the single line, thereby realizing a one-line bus.

Thus, a one-line or single-line realization for the bus 1404-2 can be employed regardless of the quantity of banks that are using the bus 1404-2 to communicate indications 1204 to the coordination circuit 126. In other words, any quantity of banks can share the bus 1404-2. As shown, the bus 1404-2 includes a shared line from the bank 410-*x* (or the UBD mitigation circuit 120-*x* thereof) to the coordination circuit 126 in the centralized portion 1402 for each bank 410 or UBD mitigation circuit 120 thereof. This shared line conserves space and reduces costs as compared to a multi-line bus. The shared line, however, involves employing a mechanism for sharing the wire.

In example implementations, the multiple banks 410-1 to 410-8 share the single-line bus 1404-2 in a time-division manner (e.g., using time-division multiplexing). In effect, the banks take turns being in control of the bus 1404-2. The coordination circuit 126, or another circuit such as a bank-shared UBD mitigation circuit 120-0 or a bank-shared error-handling circuit 122-0) can provide an indication to a given bank 410 that the given bank is assigned to control the shared bus 1404-2. While in control of the bus 1404-2, a given bank 410 can provide to the coordination circuit 126 an indication 1204 if the bank can forgo a UBD mitigation opportunity. These indications can be provided by transmitting a signal between two circuits, such as by driving a particular voltage or voltages on one or more lines of at least one bus.

In the architecture 1600 of FIG. 16, the third bank 410-3, including the third UBD mitigation circuit 120-3 that corresponds thereto, provides the indication 1204 to the coordination circuit 126 via the bus 1404-2. The bank 410-3 can drive a signal providing an affirmative or negative indication 1204. With a shared line for the bus 1404-2, the given bank 410 and the coordination circuit 126 are configured to know when signaling is to be transmitted from the given bank 410. For example, the coordination circuit 126 can signal to a particular bank that the particular bank is being granted or assigned control of the bus 1404-2. Additionally or alternatively, control of the bus 1404-2 can be based on time periods or the expiration thereof.

In some implementations, at least one circuit associated with a given bank 410* of the multiple banks 410-1 to 410-8 can receive a command to perform an error-handling operation 132 during a current usage-based-disturbance mitigation opportunity (e.g., a command to perform an initial error-handling operation 132 for a "new" round of error handling). Responsive to receipt of the command to perform the error-handling operation 132, the at least one circuit of the given bank 410* can perform the error-handling operation 132 on the given bank 410* and seize control of the line of the bus 1404-2. By gaining command of the bus 1404-2, the given bank 410* can then determine if it can forgo future UBD mitigation opportunities and signal this determination to a controller. To do so, the at least one circuit corresponding to the given bank 410* can also transmit a signal (e.g., drive a voltage) on the line of the bus 1404-2 to indicate if the given bank 410* can forgo a next usage-based-disturbance mitigation opportunity. Examples of a signaling protocol for a single-line implementation of the bus 1404-2 are described below with reference to FIG. 17.

Example Methods

Figure 11:
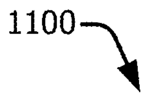
FIG. 11 illustrates an example method for implementing aspects of efficient coordination of error handling and usage-based-disturbance mitigation.
Figure 17:
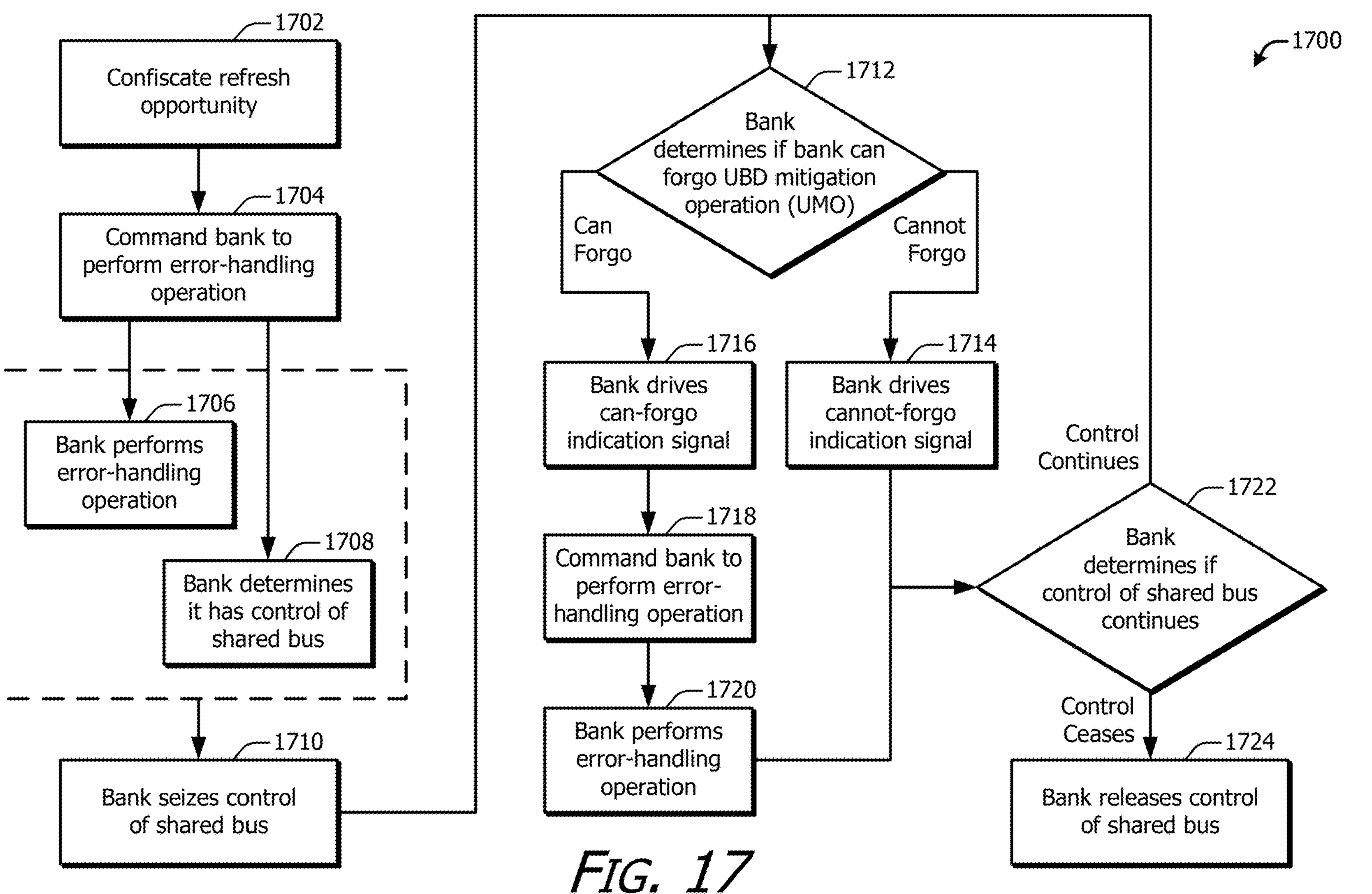
FIG. 17 is a flow chart illustrating example aspects for communicating if a bank can forgo a usage-based-disturbance mitigation opportunity in favor of error handling using at least the second bus of FIG. 16.

This section describes example methods for implementing aspects of efficient coordination of error handling and usage-based-disturbance mitigation with reference to the diagrams of FIGS. 11, 17, and 18. This description may also refer to components, entities, and other aspects depicted in FIGS. 1 to 10-2 and 12 to 16 by way of example only. The described methods are not necessarily limited to performance by one entity or multiple entities operating on one device.

FIG. 11 illustrates an example method 1100 for implementing aspects of efficient coordination of data-error handling and usage-based-disturbance mitigation. As shown, the method 1100 can include two blocks 1102 and 1104. In some cases, operations of the method 1100 are implemented by a memory device 108 as described with reference to FIGS. 1, 2, and 4. In particular, the operations of the method 1100 can be performed by the control circuitry 208 of FIGS. 2, 5-2, and 12.

At block 1102, an error-handling operation is performed on a codeword stored in a first bank of multiple banks during a refresh-pump time interval. For example, an error-handling circuit 122 can perform, during a refresh-pump time interval 610, an error-handling operation 132 on a codeword 702 stored in a first bank 410-1 of multiple banks 410-1 to 410-B. For instance, a bank-specific error-handling circuit 122-1 may detect an error in the codeword 702 using an ECC-based scheme and may store corrected data back into the first bank 410-1 during an assigned refresh-pump time interval 610.

At block 1104, a usage-based-disturbance mitigation operation is performed on a row in a second bank of the multiple banks during the refresh-pump time interval. For example, a UBD mitigation circuit 120 can perform, during the same refresh-pump time interval 610, a usage-based-disturbance mitigation operation 130 on a row 302 in a second bank 410-2 of the multiple banks 410-1 to 410-B. To do so, a bank-specific UBD mitigation circuit 120-2 may apply a charge restore operation to one or more victim rows based on an identified aggressor row, which aggressor row may be indicated using a queue or other mechanism that flags a row with a high-value activation count 308.

FIG. 17 is a flow chart 1700 illustrating example aspects for communicating if a bank can forgo a usage-based-disturbance mitigation opportunity in favor of error handling using at least the second bus 1404-2 of FIG. 16. As shown, the flow chart 1700 can include 12 blocks 1702-1724. In some cases, operations of the flow chart 1700 are implemented by a memory device 108 as described with reference to FIGS. 1, 2, and 4. In particular, the operations of the flow chart 1700 can be performed by the control circuitry 208 of FIGS. 2, 5-2, and 12 in conjunction with the bus 1404-2 of FIG. 16.

At block 1702, a refresh opportunity is confiscated. For example, a refresh circuit 124 or a coordination circuit 126 can confiscate 902 at least one refresh operation 134. At block 1704, a bank is commanded to perform an error-handling operation. For instance, the coordination circuit 126 can send an initial perform error-handling operation command 556 to a particular bank 410. To do so, the coordination circuit 126 or a bank-shared error-handling circuit 122-0 can drive bank select bits for the particular bank 410 and provide a command to perform an error-handling operation 132.

The operations of blocks 1706 and 1708 can be performed responsive to receiving the command to perform the error-handling operation 132. At block 1706, the particular bank 410 performs the error-handling operation 132, examples of which are described herein, including with reference to FIG. 7. The error-handling operation 132 may entail the checking and correcting of at least one codeword 702 in a row 302 of the particular bank 410. The error-handling operation 132 may also entail the reporting of at least the corrective measures that are taken, if any. At block 1708, the bank determines that the bank has control of the shared bus. For example, responsive to an initial command to perform an error-handling operation 132, the particular bank 410 determines that the coordination circuit 126, or another aspect of the control circuitry 208, expects to receive indications 1204 from the particular bank 410 over the shared bus 1404-2.

In some cases, if a flag indicative of control over the shared bus is not currently set or active, and if the particular bank receives a perform error-handling operation command 556, then the bank determines that the command to perform an error-handling operation is an initial command for a current round of error-handling functionality. In such cases, the particular bank can perform the initial error-handling operation 132 without regard to how pressing or risky any UBD mitigation operations may be. In this scenario, the particular bank therefore performs one error-handling operation 132 before having the opportunity to prevent performance of subsequent error-handling operations during a given round of error-handling operation opportunities for the bank.

The flowchart 1700 continues with block 1710 after the operation(s) of block 1708. Thus, the operation(s) of block 1710 can at least start before the operation(s) of block 1706 are completed, or even before such operation(s) for 1706 are started. At block 1710, the bank seizes control of the shared bus. For example, the particular bank 410 can prepare to drive a voltage on a shared single-line implementation of the bus 1404-2, set a flag indicative of control over the bus

1404-2, begin driving the voltage on the shared single-line implementation of the bus 1404-2, some combination thereof, and so forth.

At block 1712, the bank determines if the bank can forgo a UBD mitigation operation, or another UBD mitigation opportunity. For example, the particular bank 410 can inspect a usage-based-disturbance queue 802 to determine if the queue has at least one entry 804 or a particular quantity of entries, to determine if an activation count 308 in the queue meets a first or second mitigation threshold 1406, some combination thereof, and so forth. Generally, the particular bank 410 can perform any of the operations described herein for determining a current amount of risk from delaying the performance of a UBD mitigation operation 130, including those described with reference to FIGS. 8 and 14.

If the bank cannot forgo a UBD mitigation operation 130, then at block 1714 the bank drives a cannot-forgo indication 1204 signal on the single-line of the bus 1404-2. In response to the cannot-forgo indication 1204 (or in response to not receiving a can-forgo indication, depending on a default setting), the coordination circuit 126 can refrain from commanding the particular bank to perform an error-handling operation (e.g., at a next opportunity). On the other hand, if the bank can forgo a UBD mitigation operation 130 (as determined at block 1712), then at block 1716 the bank drives a can-forgo indication 1204 signal on the single-line of the bus 1404-2. This may correspond, for instance, to the potential skipping statuses 1302-1 to 1302-3.

Based on the signaling of the can-forgo indication 1204 (or the absence of a cannot-forgo indication, depending on a default setting), the bank is commanded at block 1718 to perform an error-handling operation. For example, responsive to receiving the can-forgo indication 1204 from the particular bank 410 that currently has control of the bus 1404-2, the coordination circuit 126 or the bank-shared error-handling circuit 122-0 transmits a perform error-handling operation command 556 to the particular bank 410. At block 1720, the bank performs the error-handling operation. To do so, the particular bank 410 can perform an error-handling operation 132 in manners similar to those described above with regard to block 1706.

At block 1722, the bank determines if control of the shared bus continues for the bank. This determination can be made in numerous ways. For example, a bank-specific UBD mitigation circuit 120-*x* can monitor bank select-bits on an address bus. If the bank-select bits no longer map to the corresponding bank 410-*x*, the bank-specific UBD mitigation circuit 120-*x* can determine that the bank no longer has control of the shared bus 1404-2. As another example, the bank-specific UBD mitigation circuit 120-*x* can determine that the last codeword 702 in a sequence within bank 410-*x* has completed an error-handling operation via a mechanism of address monitoring and thus determine that the bank 420 is no longer granted control of the shared bus 1404-2. As yet another example, the determination can be based on elapsed time. The bank-specific UBD mitigation circuit 120-*x* can track a countdown timer based on clock pulses or detect when a particular time has been reached. Additionally or alternatively, the determination can be based on a counter that tracks opportunities presented or operations performed. For instance, the counter can track a number of times that a refresh opportunity has been confiscated or how many times the bank has been given the opportunity to perform an error-handling operation 132. The counter may instead track a quantity of instances in which the bank has actually performed an error-handling operation 132. In such cases, the counter can count down from a predetermined (e.g., fixed or selectable/settable) quantity of error-handling operations that are performed. The predetermined quantity may be a quantity of codewords per row, a quantity of rows per column or two columns, a quantity of codewords across two or more columns, a total quantity of codewords in a bank, some combination thereof, and so forth.

If control of the shared bus continues for the current bank, then the flow of operations returns to the operation(s) of the block 1712. If, on the other hand, control ceases for the current bus, then at block 1724 the bank releases control of the shared single-line of the bus 1404-2. For example, the particular bank 410 can deactivate, power down, disconnect, or otherwise change the status of a bank-specific driver for the shared single-line implementation of the bus 1404-2, clear a flag indicative of control of the bus 1404-2, some combination thereof, and so forth.

FIG. 18 illustrates an example method 1800 for implementing aspects of communicating if a bank can forgo a usage-based-disturbance mitigation opportunity in favor of error handling to support efficient coordination of error handling and usage-based-disturbance mitigation. As shown, the method 1800 can include three blocks 1802 to 1806. In some cases, operations of the method 1800 are implemented by a memory device 108 as described with reference to FIGS. 1, 2, and 4. In particular, the operations of the method 1800 can be performed by the control circuitry 208 of FIGS. 2, 5-2, and 12.

At block 1802, a refresh pump resulting from a refresh command and corresponding to a time period is confiscated. For example, control circuitry 208 (e.g., a refresh circuit 124 or a coordination circuit 126) can confiscate a refresh pump corresponding to a time period and resulting from a refresh command that can trigger a refresh operation 134. For instance, instead of the control circuitry 208 performing a refresh operation 134, based on a refresh opportunity communication 552 provided from the refresh circuit 124, a coordination circuit 126 may assign a refresh-pump time interval 610 to one or more banks of multiple banks 410-1 to 410-B for UBD mitigation functionality or error-handling functionality. The assignment may be responsive to a current riskiness of usage-based-disturbance activities as described herein, such as based on at least one activation count 308 and at least one mitigation threshold 1406.

At block 1804, a bank of multiple banks that can forgo a usage-based-disturbance mitigation opportunity during the time period is determined. For example, a UBD mitigation circuit 120 can determine that a bank 410 of multiple banks 410-1 to 410-B can forgo a usage-based-disturbance mitigation opportunity during the time period. To do so, a bank-specific UBD mitigation circuit 120-*x* may determine that a bank 410-*x* does not currently have a risky usage-based-disturbance situation based on a usage-based-disturbance queue 802 or at least one activation count 308. In some cases, an empty usage-based-disturbance queue 802 can trigger a bank to forgo a UBD mitigation opportunity, with entries of the queue being populated based on activation counts 308 and at least one mitigation threshold 1406.

A UBD mitigation opportunity can be assigned to one or more banks responsive to a refresh opportunity (e.g., a refresh-pump time interval 610) being confiscated. A selected bank can "accept" the opportunity and perform a UBD mitigation operation 130. Alternatively, the selected bank can indicate that the bank can forgo the opportunity. The time period can correspond to a refresh operation 134 or a portion thereof. For instance, the time period can correspond to the time consumed by performing a UBD mitigation operation 130 or more than the time consumed by performing one UBD mitigation operation 130. Examples are depicted in FIG. 13 in the context of statuses for different banks.

At block 1804, an error-handling operation is performed during the time period on a codeword stored in the determined bank based on the determined bank being able to forgo the usage-based-disturbance mitigation opportunity. For example, an error-handling circuit 122 can perform, during the time period, an error-handling operation 132 on a codeword 702 stored in the determined bank 410 based on the determined bank 410 being able to forgo the usage-based-disturbance mitigation opportunity. For instance, a coordination circuit 126 may send a perform error-handling operation command 556 to the determined bank 410 responsive to receiving an indication 1204 that the bank can forgo a UBD mitigation operation 130 during the time period. Responsive to this command, the determined bank 410 may perform the error-handling operation 132 as described herein, such as with reference to FIG. 7.

For the figures described above, the order in which operations are shown and/or described is not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners. Additionally, the processes and the operations thereof across the different methods of FIGS. 11, 17, and 18 may be implemented separately or in conjunction with one another. For example, while the determined bank 410 (of block 1804) is performing the error-handling operation 132, one or more other banks can be performing at least one UBD mitigation operation 130 on at least one row (of block 1104).

Aspects of these methods may be implemented in, for example, hardware (e.g., fixed-circuit circuitry or a processor in conjunction with a memory), firmware, software, or some combination thereof. The method may be realized using one or more of the apparatuses, components, or other aspects shown in FIGS. 1 to 10-2 and 12 to 16, the components of which may be further divided, combined, rearranged, and so on. The devices and components of these figures generally represent hardware, such as electronic devices, packaged modules, IC chips, or circuits; firmware or the actions thereof; software; or a combination thereof. Thus, these figures illustrate some of the many possible systems or apparatuses capable of implementing the described methods.

Computer-readable media includes both non-transitory computer storage media and communication media including any medium that facilitates transfer of a computer program (e.g., an application) or data from one entity to another. Non-transitory computer storage media can be any available medium accessible by a computer, such as RAM, ROM, Flash, EEPROM, optical media, and magnetic media.

In the following, various examples for implementing aspects of efficient coordination of error handling and usage-based-disturbance mitigation are described:

Example 1: A memory device comprising:

multiple banks comprising a first bank and a second bank;

at least one error-handling circuit coupled to the first bank of the multiple banks, the at least one error-handling circuit configured to perform, during a refresh-pump time interval, an error-handling operation on a codeword stored in the first bank; and at least one usage-based-disturbance mitigation circuit coupled to the second bank of the multiple banks, the at least one usage-based-disturbance mitigation circuit configured to perform, during the refresh-pump time interval, a usage-based-disturbance mitigation operation on a row in the second bank.

Example 2: The memory device of example 1 or any other example(s) described herein, wherein to perform the usage-based-disturbance mitigation operation, the at least one usage-based-disturbance mitigation circuit is configured to:

perform a respective usage-based-disturbance mitigation operation on a respective row in each bank of two or more banks, the two or more banks including the second bank and a third bank of the multiple banks.

Example 3: The memory device of example 2 or any other example(s) described herein, wherein:

the memory device comprises an integrated circuit chip;

the integrated circuit chip comprises the multiple banks;

the multiple banks comprise all banks of the integrated circuit chip; and the two or more banks comprise all banks of the integrated circuit chip except for the first bank.

Example 4: The memory device of example 2 or any other example(s) described herein, wherein:

the multiple banks comprise multiple bank groups;

each respective bank in a bank group of the multiple bank groups corresponds to a respective categorization of multiple categorizations;

the first bank of the multiple banks corresponds to a first categorization of the multiple categorizations; and the two or more banks comprise all banks across the multiple bank groups corresponding to the first categorization of the multiple categorizations except for the first bank.

Example 5: The memory device of example 4 or any other example(s) described herein, wherein:

the first categorization of the multiple categorizations comprises one or more bits corresponding to a bank address.

Example 6: The memory device of example 1 or any other example(s) described herein, wherein:

the refresh-pump time interval corresponds to an opportunity to perform a refresh pump to restore a charge level of at least one row of the multiple banks.

Example 7: The memory device of example 6 or any other example(s) described herein, further comprising:

a refresh circuit coupled to at least one bank of the multiple banks, the refresh circuit configured to ascertain the opportunity to perform the refresh pump responsive to at least one of a self-refresh command or an auto-refresh command.

Example 8: The memory device of example 7 or any other example(s) described herein, wherein:

the refresh circuit is configured to ascertain the opportunity to perform the refresh pump responsive to the auto-refresh command; and the auto-refresh command comprises an all-bank refresh command (REFab) or a same-bank refresh command (REFsb).

Example 9: The memory device of example 1 or any other example(s) described herein, wherein:

the error-handling operation comprises an error check and scrub (ECS) operation; and the at least one error-handling circuit is configured to:

detect a data error in the codeword stored in the first bank; and log the data error for reporting external to the memory device.

Example 10: The memory device of example 1 or any other example(s) described herein, wherein:

the codeword includes multiple data bits and multiple check bits; and to perform the error-handling operation, the at least one error-handling circuit is configured to:

determine at least one bit error in the codeword based on an operation that uses the multiple data bits and the multiple check bits; and correct the at least one bit error in the codeword using the multiple data bits and the multiple check bits.

Example 11: The memory device of example 1 or any other example(s) described herein, wherein the at least one error-handling circuit is configured to:

perform, during the refresh-pump time interval, multiple error-handling operations on multiple codewords stored in the first bank, the multiple error-handling operations on the multiple codewords comprising the error-handling operation on the codeword stored in the first bank and another error-handling operation on another codeword stored in the first bank.

Example 12: The memory device of example 11 or any other example(s) described herein, wherein the at least one error-handling circuit is configured to:

repeatedly perform, during the refresh-pump time interval, the multiple error-handling operations on different multiple codewords in response to at least one all-bank refresh command of multiple all-bank refresh commands.

Example 13: The memory device of example 1 or any other example(s) described herein, wherein:

the multiple banks comprise a third bank;

the at least one error-handling circuit comprises a bank-shared error-handling circuit; and the bank-shared error-handling circuit is configured to:

initiate, during the refresh-pump time interval, the error-handling operation on the codeword stored in the first bank; and initiate, during another refresh-pump time interval, another error-handling operation on another codeword stored in the third bank.

Example 14: The memory device of example 1 or any other example(s) described herein, wherein to perform the usage-based-disturbance mitigation operation, the at least one usage-based-disturbance mitigation circuit is configured to:

apply a charge restore operation to restore a charge level to one or more victim rows in the second bank, the one or more victim rows comprising the row in the second bank.

Example 15: The memory device of example 14 or any other example(s) described herein, wherein to perform the usage-based-disturbance mitigation operation, the at least one usage-based-disturbance mitigation circuit is configured to:

determine an aggressor row in the second bank using at least one queue that stores one or more entries, each entry comprising a row address corresponding to an activation count, the aggressor row proximate to the one or more victim rows in the second bank.

Example 16: A method performed by a memory device to efficiently utilize a confiscated refresh opportunity, the method comprising:

performing, during a refresh-pump time interval, an error-handling operation on a codeword stored in a first bank of multiple banks; and performing, during the refresh-pump time interval, a usage-based-disturbance mitigation operation on a row in a second bank of the multiple banks.

Example 17: The method of example 16 or any other example(s) described herein, further comprising:

identifying the refresh-pump time interval that is designated to perform a refresh pump on one or more banks of the multiple banks; and confiscating the refresh-pump time interval for error-handling functionality and usage-based-disturbance mitigation functionality.

Example 18: The method of example 16 or any other example(s) described herein, further comprising:

performing the error-handling operation and the usage-based-disturbance mitigation operation so as to be at least partially overlapping in time.

Example 19: A memory device comprising:

multiple banks comprising a first bank and a second bank; and control circuitry coupled to the multiple banks, the control circuitry configured to:

identify a refresh-pump time interval designated to perform a refresh pump on one or more banks of the multiple banks;

confiscate the refresh-pump time interval for error-handling functionality and usage-based-disturbance mitigation functionality;

perform, during the refresh-pump time interval, an error-handling operation on a codeword stored in the first bank; and perform, during the refresh-pump time interval, a usage-based-disturbance mitigation operation on a row in the second bank.

Example 20: The memory device of example 19 or any other example(s) described herein, wherein:

the multiple banks comprise a third bank;

the control circuitry is configured to perform, during the refresh-pump time interval, multiple usage-based-disturbance mitigation operations including a respective usage-based-disturbance mitigation operation on a respective row of two or more banks of the multiple banks;

the two or more banks comprise the second bank and the third bank;

the two or more banks exclude the first bank; and performance of at least one usage-based-disturbance mitigation operation of the multiple usage-based-disturbance mitigation operations at least partially overlaps performance of the error-handling operation on the codeword stored in the first bank.

Example 21: A memory device comprising:

multiple banks; and control circuitry coupled to the multiple banks, the control circuitry configured to:

confiscate a refresh pump resulting from a refresh command and corresponding to a time period;

determine that a bank of the multiple banks can forgo a usage-based-disturbance mitigation opportunity during the time period; and perform, during the time period, an error-handling operation on a codeword stored in the determined bank based on the determined bank being able to forgo the usage-based-disturbance mitigation opportunity.

Example 22: The memory device of example 21 or any other example(s) described herein, wherein:

the usage-based-disturbance mitigation opportunity corresponds to a refresh opportunity that has been confiscated for at least one of error-handling functionality or usage-based-disturbance mitigation functionality.

Example 23: The memory device of example 22 or any other example(s) described herein, wherein:

the refresh opportunity comprises at least one refresh-pump time interval.

Example 24: The memory device of example 22 or any other example(s) described herein, wherein:

the refresh opportunity results from at least one all-bank refresh (REFab) command.

Example 25: The memory device of example 21 or any other example(s) described herein, wherein the control circuitry is configured to:

perform, during the time period, the error-handling operation on the codeword stored in the determined bank instead of performing a usage-based-disturbance mitigation operation on a row of the determined bank during the time period.

Example 26: The memory device of example 25 or any other example(s) described herein, wherein the control circuitry is configured to:

perform, during the time period, at least one usage-based-disturbance mitigation operation on at least one row of one or more other banks of the multiple banks, the one or more other banks excluding the determined bank.

Example 27: The memory device of example 21 or any other example(s) described herein, wherein to determine that a bank can forgo the usage-based-disturbance mitigation opportunity during the time period, the control circuitry is configured to:

determine that no row of the determined bank corresponds to an activation count that meets at least one mitigation threshold.

Example 28: The memory device of example 27 or any other example(s) described herein, wherein to determine that no row of the determined bank corresponds to an activation count that meets the at least one mitigation threshold, the control circuitry is configured to:

determine that a queue is empty of entries, the queue configured to store one or more entries that each respectively corresponds to a row of the determined bank that has an activation count that meets the at least one mitigation threshold.

Example 29: The memory device of example 21 or any other example(s) described herein, wherein to determine that a bank can forgo the usage-based-disturbance mitigation opportunity during the time period, the control circuitry is configured to:

propagate a signal from the determined bank to a coordination circuit of the control circuitry, the coordination circuit positioned in a centralized portion of an integrated circuit chip of the memory device, the signal indicative that the determined bank can forgo the usage-based-disturbance mitigation opportunity during the time period.

Example 30: The memory device of example 29 or any other example(s) described herein, further comprising:

a one-line bus coupled between the coordination circuit and a usage-based-disturbance mitigation circuit associated with the determined bank, wherein the usage-based-disturbance mitigation circuit is configured to transmit the signal to the coordination circuit using the one-line bus.

Example 31: The memory device of example 21 or any other example(s) described herein, wherein:

the control circuitry comprises:

a coordination circuit; and a bank-specific usage-based-disturbance mitigation circuit corresponding to the determined bank;

the memory device comprises a bus coupled between the coordination circuit and the bank-specific usage-based-disturbance mitigation circuit; and the bank-specific usage-based-disturbance mitigation circuit is configured to transmit, to the coordination circuit via the bus, a signal indicative that the determined bank can forgo the usage-based-disturbance mitigation opportunity during the time period.

Example 32: The memory device of example 21 or any other example(s) described herein, further comprising:

a bus comprising multiple lines, each respective line of the multiple lines coupled to a respective bank of the multiple banks, wherein the control circuitry is configured to use each respective line of the multiple lines to communicate if the respective bank of the multiple banks can forgo a usage-based-disturbance mitigation opportunity.

Example 33: The memory device of example 21 or any other example(s) described herein, further comprising:

a bus comprising a line that is coupled to each bank of the multiple banks, wherein the control circuitry is configured to use the line to communicate if each bank of the multiple banks can forgo a usage-based-disturbance mitigation opportunity.

Example 34: The memory device of example 33 or any other example(s) described herein, wherein:

each respective bank of the multiple banks is configured to share the line of the bus in a time-division manner to communicate if the respective bank can forgo a usage-based-disturbance mitigation opportunity.

Example 35: The memory device of example 34 or any other example(s) described herein, wherein at least one circuit associated with a given bank of the multiple banks is configured to:

receive a command to perform an error-handling operation during a current usage-based-disturbance mitigation opportunity; and responsive to receipt of the command to perform the error-handling operation, perform the error-handling operation on the given bank;

seize control of the line of the bus; and transmit a signal on the line of the bus to indicate if the given bank can forgo a next usage-based-disturbance mitigation opportunity.

Example 36: A method performed by a memory device to efficiently utilize a confiscated refresh opportunity, the method comprising:

confiscating a refresh pump resulting from a refresh command and corresponding to a time period;

determining that a bank of multiple banks can forgo a usage-based-disturbance mitigation opportunity during the time period; and performing, during the time period, an error-handling operation on a codeword stored in the determined bank based on the determined bank being able to forgo the usage-based-disturbance mitigation opportunity.

Example 37: The method of example 36 or any other example(s) described herein, wherein the determining comprises:

determining that the bank can forgo the usage-based-disturbance mitigation opportunity based on multiple activation counts that correspond to multiple rows of the bank and at least one mitigation threshold.

Example 38: A memory device comprising:

a bus;

multiple banks coupled to the bus and configured to share the bus in a time-division manner across two or more banks of the multiple banks; and control circuitry coupled to the bus, the control circuitry configured to:

provide, to at least one circuit corresponding to a selected bank of the multiple banks, an indication that the selected bank is assigned to control the bus, the two or more banks including the selected bank; and receive, via the bus from the at least one circuit corresponding to the selected bank, a signal indicating if the selected bank can forgo a usage-based-disturbance mitigation opportunity.

Example 39: The memory device of example 38 or any other example(s) described herein, wherein the control circuitry is configured to:

responsive to the signal indicating that the selected bank can forgo a usage-based-disturbance mitigation opportunity, command the at least one circuit corresponding to the selected bank to perform an error-handling operation; and responsive to the signal indicating that the selected bank cannot forgo a usage-based-disturbance mitigation opportunity, cause the at least one circuit corresponding to the selected bank to perform a usage-based-disturbance mitigation operation.

Example 40: The memory device of example 38 or any other example(s) described herein, wherein:

responsive to the indication that the selected bank is assigned to control the bus, the at least one circuit corresponding to the selected bank is configured to:

seize control of the bus; and transmit the signal indicating if the selected bank can forgo a usage-based-disturbance mitigation opportunity; and responsive to the indication that the selected bank is assigned to control the bus, at least one other circuit corresponding to another bank of the two or more banks is configured to:

refrain from using the bus.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although aspects of efficient coordination of error handling and usage-based-disturbance mitigation have been described in language specific to certain features and/or methods, the subject of the appended claims is not necessarily limited to the specific features or methods described. Rather, the specific features and methods are disclosed as a variety of example implementations of efficient coordination of error handling and usage-based-disturbance mitigation.

What is claimed is:

1. A memory device comprising:

multiple banks comprising a first bank and a second bank, each bank of the multiple banks subject to one or more refresh operations in accordance with a refresh-command time interval to maintain data stored in each bank of the multiple banks, the refresh-command time interval comprising multiple refresh-pump time intervals;

at least one error-handling circuit coupled to the first bank of the multiple banks, the at least one error-handling circuit configured to perform, during a refresh-pump time interval of the multiple refresh-pump time intervals, an error-handling operation on a codeword stored in the first bank, the codeword comprising multiple data bits and multiple check bits; to perform the error-handling operation, the at least one error-handling circuit is configured to:

check for at least one bit error in the codeword based on an operation that uses the multiple data bits and the multiple check bits; and correct the at least one bit error in the codeword using the multiple data bits and the multiple check bits responsive to detection of the at least one bit error; and at least one usage-based disturbance mitigation circuit coupled to the second bank of the multiple banks, the at least one usage-based disturbance mitigation circuit configured to perform, during the refresh-pump time interval of the multiple refresh-pump time intervals, a usage-based disturbance mitigation operation on a row in the second bank.

2. The memory device of claim 1, wherein to perform the usage-based disturbance mitigation operation, the at least one usage-based disturbance mitigation circuit is configured to:

perform a respective usage-based disturbance mitigation operation on a respective row in each bank of two or more banks, the two or more banks including the second bank and a third bank of the multiple banks.

3. The memory device of claim 2, wherein:

the memory device comprises an integrated circuit chip;

the integrated circuit chip comprises the multiple banks;

the multiple banks comprise all banks of the integrated circuit chip; and the two or more banks comprise all banks of the integrated circuit chip except for the first bank.

4. The memory device of claim 2, wherein:

the multiple banks comprise multiple bank groups;

each respective bank in a bank group of the multiple bank groups corresponds to a respective categorization of multiple categorizations;

the first bank of the multiple banks corresponds to a first categorization of the multiple categorizations; and the two or more banks comprise all banks across the multiple bank groups for those banks corresponding to the first categorization of the multiple categorizations except for the first bank.

5. The memory device of claim 4, wherein:

the first categorization of the multiple categorizations comprises one or more bits corresponding to a bank address.

6. The memory device of claim 1, wherein:

the refresh-pump time interval corresponds to an opportunity to perform a refresh pump to restore a charge level of at least one row of the multiple banks.

7. The memory device of claim 6, further comprising:

a refresh circuit coupled to at least one bank of the multiple banks, the refresh circuit configured to ascertain the opportunity to perform the refresh pump responsive to at least one of a self-refresh command or an auto-refresh command.

8. The memory device of claim 7, wherein:

the refresh circuit is configured to ascertain the opportunity to perform the refresh pump responsive to the auto-refresh command; and the auto-refresh command comprises an all-bank refresh command (REFab) or a same-bank refresh command (REFsb).

9. The memory device of claim 1, wherein:

the error-handling operation comprises an error check and scrub (ECS) operation; and the at least one error-handling circuit is configured to:

detect a data error in the codeword stored in the first bank; and log the data error for reporting external to the memory device.

10. The memory device of claim 1, wherein:

the at least one error-handling circuit and the at least one usage-based disturbance mitigation circuit are coordinated such that the error-handling operation and the usage-based disturbance mitigation operation are performed so as to be at least partially overlapping in time during the refresh-pump time interval.

11. The memory device of claim 1, wherein the at least one error- handling circuit is configured to:

perform, during the refresh-pump time interval, multiple error-handling operations on multiple codewords stored in the first bank, the multiple error-handling operations on the multiple codewords comprising the error-handling operation on the codeword stored in the first bank and another error-handling operation on another codeword stored in the first bank.

12. The memory device of claim 11, wherein the at least one error-handling circuit is configured to:

repeatedly perform, during the refresh-pump time interval, the multiple error-handling operations on different multiple codewords in response to at least one all-bank refresh command of multiple all-bank refresh commands.

13. The memory device of claim 1, wherein:

the multiple banks comprise a third bank;

the at least one error-handling circuit comprises a bank-shared error-handling circuit; and the bank-shared error-handling circuit is configured to:

initiate, during the refresh-pump time interval, the error-handling operation on the codeword stored in the first bank; and initiate, during another refresh-pump time interval, another error-handling operation on another codeword stored in the third bank.

14. The memory device of claim 1, wherein to perform the usage-based disturbance mitigation operation, the at least one usage-based disturbance mitigation circuit is configured to:

apply a charge restore operation to restore a charge level to one or more victim rows in the second bank, the one or more victim rows comprising the row in the second bank.

15. The memory device of claim 14, wherein to perform the usage-based disturbance mitigation operation, the at least one usage-based disturbance mitigation circuit is configured to:

determine an aggressor row in the second bank using at least one queue that stores one or more entries, each entry comprising a row address corresponding to an activation count, the aggressor row proximate to the one or more victim rows in the second bank.

16. A method performed by a memory device to efficiently utilize a confiscated refresh opportunity, the method comprising:

performing one or more refresh operations in accordance with a refresh-command time interval to maintain data stored in multiple banks, the refresh-command time interval comprising multiple refresh-pump time intervals;

performing, during a refresh-pump time interval of the multiple refresh-pump time intervals, an error-handling operation on a codeword stored in a first bank of the multiple banks, the codeword comprising multiple data bits and multiple check bits, the performing of the error-handling operation comprising:

checking for at least one bit error in the codeword based on an operation that uses the multiple data bits and the multiple check bits; and correcting the at least one bit error in the codeword using the multiple data bits and the multiple check bits responsive to detection of the at least one bit error; and performing, during the refresh-pump time interval of the multiple refresh-pump time intervals, a usage-based disturbance mitigation operation on a row in a second bank of the multiple banks.

17. The method of claim 16, further comprising:

identifying the refresh-pump time interval that is designated to perform a refresh pump on one or more banks of the multiple banks; and confiscating the refresh-pump time interval for error-handling functionality and usage-based-disturbance mitigation functionality.

18. The method of claim 16, further comprising:

performing the error-handling operation and the usage-based disturbance mitigation operation so as to be at least partially overlapping in time.

19. A memory device comprising:

multiple banks comprising a first bank and a second bank, each bank of the multiple banks subject to one or more refresh operations in accordance with a refresh-command time interval to maintain data stored in each bank of the multiple banks, the refresh-command time interval comprising multiple refresh-pump time intervals; and control circuitry coupled to the multiple banks, the control circuitry configured to:

identify a refresh-pump time interval of the multiple refresh-pump time intervals that is designated to perform a refresh pump on one or more banks of the multiple banks;

confiscate the refresh-pump time interval of the multiple refresh-pump time intervals for error-handling functionality and usage-based-disturbance mitigation functionality;

perform, during the refresh-pump time interval of the multiple refresh-pump time intervals, an error-handling operation on a codeword stored in the first bank; and perform, during the refresh-pump time interval of the multiple refresh-pump time intervals, a usage-based disturbance mitigation operation on a row in the second bank so as to at least partially overlap performance of the error-handling operation on the codeword stored in the first bank.

20. The memory device of claim 19, wherein:

the multiple banks comprise a third bank;

the control circuitry is configured to perform, during the refresh-pump time interval, multiple usage-based disturbance mitigation operations including a respective usage-based disturbance mitigation operation on a respective row of two or more banks of the multiple banks;

the two or more banks comprise the second bank and the third bank; and the two or more banks exclude the first bank.

* * * * *